United States Patent
Mori et al.

[11] Patent Number: 5,281,489
[45] Date of Patent: Jan. 25, 1994

[54] ELECTROLUMINESCENT ELEMENT

[75] Inventors: Yoshihiko Mori; Hiroshi Endo, both of Fuji, Japan

[73] Assignee: Asashi Kasei Kogyo Kabushiki Kaisha, Osaka, Japan

[21] Appl. No.: 760,190

[22] Filed: Sep. 16, 1991

[51] Int. Cl.$^5$ .......................................... H05B 33/14
[52] U.S. Cl. .................................. 428/690; 428/691; 428/917; 313/503; 313/504; 313/506; 313/507; 313/498
[58] Field of Search ................... 428/690, 691, 917; 313/503, 504, 506, 507, 498

[56] References Cited

U.S. PATENT DOCUMENTS

| | | |
|---|---|---|
| 3,172,862 | 3/1965 | Gurnee et al. ............... 252/301.3 |
| 3,173,050 | 3/1965 | Gurnee et al. ............... 313/108 |
| 3,995,299 | 11/1976 | Partridge ...................... 357/8 |
| 4,356,429 | 10/1982 | Tang .............................. 313/503 |
| 4,539,507 | 9/1985 | Van Slyke et al. ............ 313/504 |
| 4,720,432 | 1/1988 | Van Slyke et al. ............ 428/457 |
| 4,725,513 | 2/1988 | Eguchi et al. ................. 428/690 |
| 4,762,292 | 9/1988 | Tang et al. .................... 428/690 |

FOREIGN PATENT DOCUMENTS

| | | |
|---|---|---|
| 6737886 | 2/1986 | Japan . |
| 2-250292 | 10/1990 | Japan . |
| 2-291696 | 12/1990 | Japan . |
| 3-26780 | 2/1991 | Japan . |
| 1385911 | 3/1975 | United Kingdom . |

OTHER PUBLICATIONS

World Patents Index Latest, Week 9107, Derwent Publications Ltd., London, GB; AN 91-048183.
Patent Abstracts of Japan, vol. 15, No. 60, Feb. 13, 1991, & JP-A-289 675, Nov. 29, 1990.
M. Kawabe et al, Japan J. Appl. Phys., 10, 527-528 (1971)—"Electroluminescence of Green Light Region in Doped Anthracene".
R. H. Partridge, Polymer, 24, 748-754 (1983)—"Electroluminescence from polyvinylcarbazole films: 3. Electroluminescent devices".
R. H. Partridge, Polymer, 24, 755-762 (1983)—"Electroluminescence from polyyvinylcarbazole films: 4. Electroluminescence using higher work function cathodes".

Primary Examiner—Ellis P. Robinson
Assistant Examiner—Charles R. Nold
Attorney, Agent, or Firm—Birch, Stewart, Kolasch & Birch

[57] ABSTRACT

Disclosed is an electroluminescent element comprising an anode, a cathode and, disposed therebetween, an organic luminescent layer comprising a mixture of a fluorescent luminescent agent, at least one hole moving and donating agent capable of moving holes and donating the same to the luminescent agent and at least one electron moving and donating agent capable of moving electrons and donating the same to the luminescent agent. In the element, the components of the luminescent layer have specific oxidation potential and reduction potential relationships. The element emits light in response to electrical signals. The element exhibits high luminescence efficiency and brightness even at low voltages, and it can efficiently be produced at low cost.

35 Claims, 1 Drawing Sheet

ELECTROLUMINESCENT ELEMENT

BACKGROUND OF THE INVENTION

1. Field of the Invention

The present invention relates to an electroluminescent element. More particularly, the present invention is concerned with an electroluminescent element comprising an anode, a cathode and, disposed therebetween, an organic luminescent layer comprising a mixture of a fluorescent luminescent agent, at least one hole moving and donating agent capable of moving holes and donating the same to the luminescent agent and at least one electron moving and donating agent capable of moving electrons and donating the same to the luminescent agent. In the element, the components of the luminescent layer have specific oxidation potential and reduction potential relationships therebetween. The element emits light in response to electrical signals.

The electroluminescent element of the present invention exhibits high luminescence efficiency and brightness, even at low voltages, and it can efficiently be produced at low cost.

2. Discussion of Related Art

Electroluminescent elements or devices are known, each of which comprises opposite electrodes and, disposed therebetween, an organic luminescent (light emitting) layer. Electrons are injected from one of the opposite electrodes, while holes are injected from the other of the opposite electrodes. When the injected electrons are recombined with the injected holes in the organic luminescent layer, light is emitted. In such an electroluminescent element, single crystalline anthracene and other single crystalline materials have been employed as an organic luminescent material for constructing the luminescent layer. The employment of single crystalline materials is however disadvantageous from the viewpoint of manufacturing cost and mechanical strength. Further, single crystalline materials inevictably have drawbacks in that a layer having an extremely small thickness is not easily formed, only a faint light is emitted with a single crystal having a thickness of about 1 mm and a driving voltage as high as 100 V or more is frequently required. Due to the above disadvantages and drawbacks, the single crystal materials have not yet been practically used in an electroluminescent element.

Attempts have been made to form a film of anthracene or the like having a thickness as small as 1 μm or less by vapor deposition techniques (see Thin Solid Films, vol. 94, page 171, 1982). For a film to have desired performances, it is requisite that a thin film of only several thousand Angstroms or so in thickness be prepared under strictly controlled film-forming conditions. However, it should be noted that even if a luminescent layer is formed of such a thin film, the densities of holes and electrons as carriers are so low in the layer that the transportation and recombination of the carries cannot be satisfactorily accomplished, thereby causing efficient light emission to be unattainable. Especially, no satisfactory power consumption and brightness have been attained by only the use of such a thin film.

U.S. Pat. Nos. 4,356,429, 4,539,507 (corresponding to EP-A-120,673) and 4,720,432 (corresponding to EP-A-278,758) disclose electroluminescent elements in which a hole injecting layer is disposed between an anode and a luminescent layer in order to increase the density of holes as carriers and hence to obtain improved luminescence efficiency. In the electroluminescent elements of these patents, a material having excellent electron injecting and transporting properties as well as fluorescence efficiency must be used as the luminescent layer. However, no material disclosed therein is satisfactory in the above-mentioned properties and efficiency.

Moreover, Japanese Patent Application Laid-Open Specification Nos. 61-37886/1986, 2-250292/1990, 2-291696/1990 and 3-790/1991 disclose the use as a luminescent layer of a thin film of a mixture of a compound having fluorescence and having the capability of hole transportation and a compound having the capability of electron transportation, and also disclose the use, as a luminescent layer, of a thin film of a mixture of a compound having the capability of hole transportation and a compound having fluorescence and having the capability of electron transportation. That is, in the electroluminescent elements of these patent documents, a single compound serves to accomplish both the transportation of holes or electrons and light emission. However, any compound disclosed therein cannot satisfactorily perform both of the transportation of holes or electrons and the light emission at high efficiency. Accordingly, these conventional electroluminescent elements exhibit unsatisfactory brightness and power consumption.

Further, U.S. Pat. No. 4,769,292 discloses an electroluminescent element comprising in sequence an anode, an organic hole injecting and transporting layer, a luminescent layer and a cathode, in which the luminescent layer is formed of a thin film comprised of an organic host material forming a layer capable of sustaining both hole and electron injection and a small proportion of a fluorescent material. However, no material disclosed therein is satisfactory for performing injection of both the holes and electrons with high efficiency. Moreover, the transportation of holes and electrons to luminescence centers (fluorescent material), which is another step which is very important for obtaining high luminescence efficiency and brightness in the electroluminescent element, cannot satisfactorily be accomplished by any material described therein. Therefore, the disclosed electroluminescent element is unsatisfactory in respect of brightness and power consumption.

SUMMARY OF THE INVENTION

In the current situation as described above, the present inventors have conducted extensive and intensive studies with a view toward developing an electroluminescent element free from the above-mentioned drawbacks of the prior art and capable of exhibiting excellent luminescence efficiency and brightness. As a result, it has unexpectedly been found that such a desired electroluminescent element can be obtained by employing an organic luminescent layer comprised of a mixture of a fluorescent luminescent agent, a hole moving and donating agent capable of moving holes and donating the same to the fluorescent agent and an electron moving and donating agent capable of moving electrons and donating the same to the fluorescent agent, wherein the components of the luminescent layer are chosen so as to have specific oxidation potential and reduction potential relationships therebetween. On the basis of this unexpected finding, the present invention has been completed.

Accordingly, it is an object of the present invention to provide a novel electroluminescent element exhibiting excellent luminescence efficiency and brightness even at low voltage and low current density, which can efficiently be produced at low cost.

The foregoing and other objects, features and advantages of the present invention will be apparent from the following detailed description and appended claims taken in connection with the accompanying drawings.

DETAILED DESCRIPTION OF THE INVENTION

Figure 1:
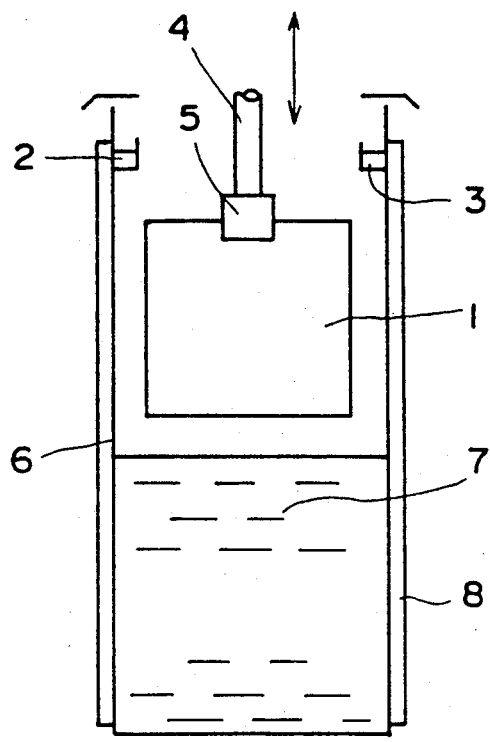
FIG. 1 is a diagrammatic view illustrating one form of a dipping coating apparatus for use in the preparation of an electroluminescent element according to the present invention.

In one and principal aspect of the present invention, there is provided an electroluminescent element comprising:

an anode for injecting holes, a cathode for injecting electrons and, disposed therebetween, an organic luminescent layer, at least one of the anode and cathode being transparent, the organic luminescent layer comprising a mixture of at least one fluorescent luminescent agent, at least one hole moving and donating agent capable of moving the holes injected from the anode and donating the holes to the luminescent agent, and at least one electron moving and donating agent capable of moving the electrons injected from the cathode and donating the electrons to the luminescent agent, the luminescent agent having a first oxidation potential which is equal to or less noble relative to that exhibited by the hole moving and donating agent, the luminescent agent having a first reduction potential which is equal to or noble relative to that exhibited by the electron moving and donating agent, the first oxidation potential of the respective agent and the first reduction potential of the respective agent being measured by cyclic voltammetry with respect to a solution of the respective agent in a solvent for the agent.

Hereinbelow, the present invention will be described in greater detail.

To attain excellent luminescence efficiency and brightness in an organic electroluminescent element, it is requisite that both holes and electrons be injected at a high efficiency from the electrodes, that both holes and electrons be moved to a luminescence center where they are recombined, and that the recombination be effected at a high luminescence efficiency at the luminescence center. Major conventional means for meeting these requirements have resided in disposing a hole injecting and transporting layer between an anode and a luminescent layer comprised of a luminescent agent having the ability to move electrons injected from a cathode, or disposing an electron injecting and transporting layer between a cathode and a luminescent layer comprised of a luminescent agent having the ability to move holes injected from an anode, so as to form a structure comprised of functionally different layers. This prior art has a drawback in that in the case of the use of an electron-transporting luminescent layer, holes cannot be effectively transported to the luminescence center and in the case of the use of a hole-transporting luminescent layer, electrons cannot be effectively transported to the luminescence center. By contrast, in the present invention, an electroluminescent element having excellent luminescence efficiency and brightness is obtained by the use of an organic luminescent layer comprising a mixture of a luminescent agent, a hole moving and donating agent and an electron moving and donating agent. The reason for the above has not yet been elucidated. However, the following presumption is possible. Effective transportation of electrons and holes to the luminescence center is achieved by a mixture of a hole moving and donating agent and an electron moving and donating agent, while effective luminescence on the luminescence center is achieved by an appropriately chosen luminescent agent having high fluorescence efficiency.

The terminology "hole moving and donating agent" used herein means a material which is capable of moving the holes injected from an anode to a fluorescent luminescent agent forming a luminescence center, where the holes are donated to the fluorescent luminescent agent. The compound for use as the hole moving and donating agent has a first oxidation potential, as measured with respect to a solution of the compound in a solvent therefor, which is not limited but generally less noble as compared to +2.00 V. Further, this compound exhibits a hole mobility of at least $1 \times 10^{-10}$ cm$^2$/V·sec at a field strength of $1 \times 10^5$ V/cm. The hole mobility of the hole moving and donating agent can be measured according to the customary time-of-flight method (TOF method) (described in J. Appl Phys., 43, No. 12, PP. 5033–5040 (1972) by W. D. Gill et al.).

Either low molecular weight compounds or high molecular weight polymers can be employed as the hole moving and donating agent.

Preferred examples of low molecular weight compounds include an anthracene compound, such as 2, 6, 9, 10-tetraisopropoxyanthracene; an oxadiazole compound, such as 2, 5-bis(4-diethylaminophenyl)-1, 3, 4-oxadiazole; a triphenyl amine compound, such as N, N'-diphenyl-N, N'-di (3-methylphenyl)-1, 1'-biphenyl-4, 4'-diamine; an aromatic tertiary amine compound, such as N-phenyl carbazole; N-isopropyl-carbazole and compounds described as being suitable as a hole transporting layer in Japanese Patent Application Laid-Open Specification No. 63-264692; a pyrazoline compound, such as 1-phenyl-3-(p-diethylaminostyryl)-5-(p-diethylaminophenyl)-2-pyrazoline; a styryl compound, such as 9-(p-diethylaminostyryl)anthracene; a hydrazone compound, such as p-diethylminobenzaldehyde-(diphenylhydrazone); a triphenylmethane compound, such as bis(4-dimethylamino-2-methylphenyl)-phenylmethane; a stilbene compound, such as α-(4-methoxyphenyl)-4-N, N-diphenylamino(4'methoxy)stilbene; an enamine compound, such as 1, 1-(4,4'-diethoxyphenyl)-N, N-(4, 4'-dimethoxyphenyl)enamine; a metal- or a non-metalphthalocyanine compound; and a porphyrin compound.

Examples of polymers for use as the hole moving and donating agent include polymers having a main chain or a side chain containing a low molecular weight compound as a hole moving and donating agent. Representative examples of such polymers are as follows:

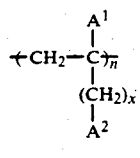 (1)

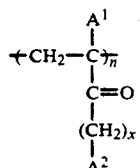 (2)

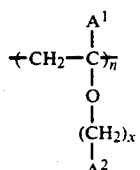 (3)

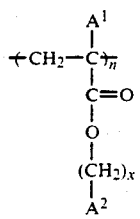 (4)

wherein $A^1$ represents a hydrogen atom or an alkyl group having 1 to 8 carbon atoms, $A^2$ represents an aromatic residue, x and n are an integer of from 0 to 6 and an integer of 3 or more, respectively.

Examples of aromatic residues represented by $A^2$ are as follows:

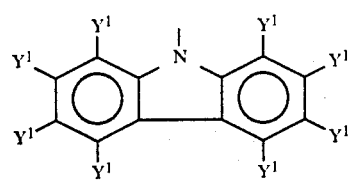 (5)

wherein $Y^1$ represents a hydrogen atom, a bromine atom, or a chlorine atom,

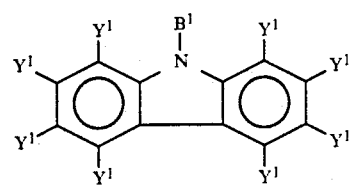 (6)

wherein $Y^1$ is as defined above, and $B^1$ represents a phenyl group, an isopropyl group, or an ethyl group,

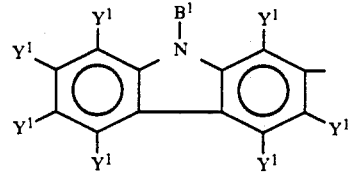 (7)

wherein $Y^1$ and $B^1$ are as defined above,

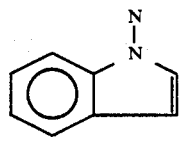 (8)

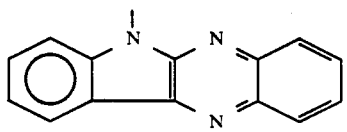 (9)

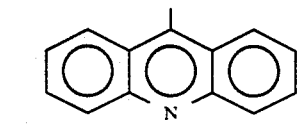 (10)

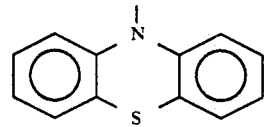 (11)

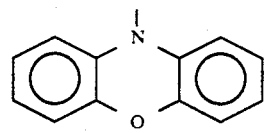 (12)

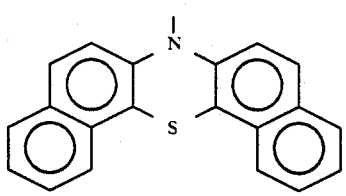 (13)

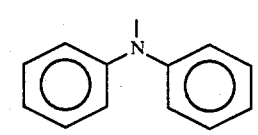 (14)

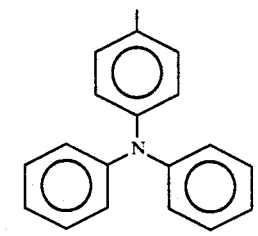 (15)

-continued

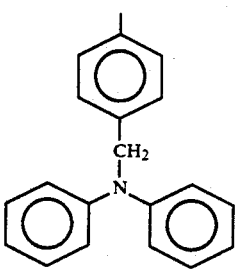
(16)

wherein $B^2$ is an alkyl group having 1 to 6 carbon atoms,

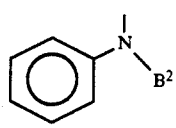
(17)

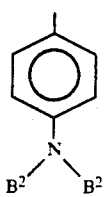
(18)

wherein $B^2$ is an alkyl group having 1 to 6 carbon atoms,

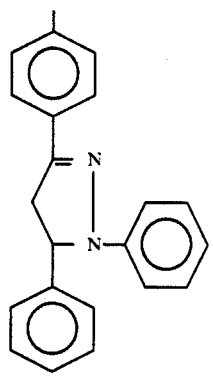
(19)

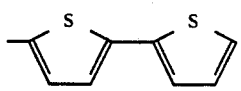
(20)

Specific examples of such polymers used as the hole moving and donating agent include poly(N-vinylcarbazole), poly(3,6-dibromo-N-vinylcarbazole), poly(4-diphenylaminophenylmethyl methacrylate), a polyester produced from 2,6-dimethoxy-9,10-dihydroxyanthracene and a dicarboxylic acid chloride, a condensation polymer produced from 3,3'-diaminobenzidine and 3,3',4,4'-benzophenonetetracarboxylic acid dianhydride, a condensation polymer produced from a triphenylamine compound and a dicarboxylic acid chloride, and polysilylenes, such as poly(phenylmethylsilylene) and poly(diphenylsilylene).

These hole moving and donating agents can be used individually or in combination.

The terminology "electron moving and donating agent" used herein means a material which is capable of moving electrons injected from a cathode to a fluorescent luminescent agent as a luminescence center, where the electrons are donated to the fluorescent luminescent agent.

The electron moving and donating agent exhibits a first reduction potential, as measured with respect to a solution of the agent in a solvent therefor, which is not limited but generally noble as compared to −2.50 V, preferably −2.00 V. This nobility of the first reduction potential is preferred from the viewpoint of lowering of electron-injection barrier to thereby attain an improved luminescence.

Either low molecular weight compounds or high molecular weight polymers can be employed as the electron moving and donating agent. Preferred examples of low molecular weight compounds include various dyes and pigments, such as a triphenylmethane having an amino group or a derivative thereof, a xanthene, an acridine, an azine, a thiazine, a thiazole, an oxazine, and an azo; an indanthrene dye, such as flavanthrone; a perinone pigment; a perylene pigment; a cyanine color; an electron acceptor, such as 2,4,7-trinitrofluorenone, tetracyanoquinodimethane and tetracyanoethylene; a metal or non-metal phthalocyanine having an electron attracting substituent attached to the ring; a porphyrin having a pyridyl group, a quinolyl group or a quinoxaryl group attached to the ring; metal complexes of 8-hydroxyquinolines; diarylbutadienes, such as 1,4-diphenylbutadiene and 1,1,4,4-tetraphenylbutadiene; stilbenes, such as 4,4'-bis[5,7-di(tert-pentyl)-2-benzoxazolyl]stilbene, 4,4'-bis(5-methyl-2-benzoxazolyl)-stilbene, and trans-stilbene; thiophenes, such as 2,5-bis[5,7-di-(tert-pentyl)-2-benzoxazolyl]thiophene, and 2,5-bis[5-(α,α-dimethylbenzyl)-2-benzoxanolyl]-thiophene, and 2,5-bis[5,7-di(tert-pentyl)-2-benzoxazolyl]-3,4-diphenylthiophene; benzothiazoles, such as 2,2'-(1,4-phenylenedivinylene)bisbenzothiazole and 2(p-dimethylaminostyryl)benzothiazol; and styryl compounds, such as 1,4-bis(2-methylstyryl)benzene, 2-(p-dimethylaminostyryl)benzoxazole, 2-(p-dimethylaminostyryl)quinoline, 4(p-dimethylaminostyryl)-quinoline, 2-(p-dimethylaminostyryl)-3,3'-dimethyl-3H-indole and 2-(p-dimethylaminostyryl)naphtho[1,2-d]thiazole.

Other preferred examples of low molecular weight compounds include condensed polycyclic, aromatic compounds, such as anthracene, tetracene, pentacene, pyrene, chrysene, perylene, coronene, 3,4-benzofluoranthene, 1,2-benzanthracene, 2,3-benzofluorene, 1,12-benzoperylene, 3,4-benzopyrene, 4,5-benzopyrene, 9,10-bis(4-methoxyphenyl)anthracene, 1-chloro-9,10-diphenylanthracene, 9,10-diphenylanthracene, 9-phenylanthracene, 4,5-methylenephenanthrene, decacyclene, 1,2:3,4-dibenzanthracene, 1,2:5,6-dibenzanthracene, periflanthene, 4,7-diphenyl-1,10-phenanthroline, fluoranthene, 3-methylcholanthrene, rubrene, triphenylene, benzo[ghi]perylene and 4H-cyclopenta[def]-phenanthrene, and their derivatives having an alkyl substituent having 1 to 20 carbon atoms, and also include aromatic compounds, such as 1,3-diphenylisobenzofuran, 1,2,3,4-tetraphenyl-1,3-cyclopentadiene and pentaphenylcyclopentadiene.

Further examples of low molecular weight compounds for use as the electron moving and donating agent include an oxadiazole compound of formula (21), and oxazole compounds of formulae (22) and (23),

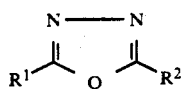 (21)

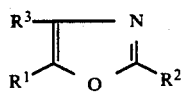 (22)

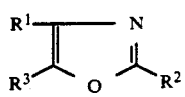 (23)

wherein each of $R^1$ and $R^2$ independently represents a phenyl group, a biphenyl group, a naphthyl group, an anthryl group, a phenanthrenyl group, a pyrenyl group, a pyridyl group, a pyrazolyl group, a quinolyl group, a thiazolyl group, a benzothiazolyl group, an oxadiazolyl group, an oxazolyl group, or a benzoxazolyl group, provided that these groups may be substituted with a hydroxy group, a cyano group, a halogen atom, an $R^4$ group, an $OR^4$ group or an

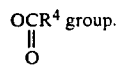 group.

$R^4$ employed above represents a straight chain or branched alkyl group having 1 to 19 carbon atoms, a cycloalkyl group having 5 to 18 carbon atoms, an alkenyl group having 2 to 4 carbon atoms, a dialkylamino group having 1 to 3 carbon atoms, a phenyl group, a biphenyl group, a naphthyl group, an anthryl group, a phenanthrenyl group, a pyrenyl group, a pyridyl group, a pyrazolyl group, a quinolyl group, a thiazolyl group, a benzothiazolyl group, an oxadiazolyl group, an oxazolyl group or a benzoxazolyl group. These groups may have a substituent, such as a hydroxy group, a cyano group, a halogen atom, a straight chain or branched alkyl group having 1 to 19 carbon atoms, a cycloalkyl group having 5 to 18 carbon atoms, an alkenyl group having 2 to 4 carbon atoms, an alkoxy group having 1 to 19 carbon atoms, an alkylcarbonyloxy group having 1 to 19 carbon atoms, a cycloalkylcarbonyloxy group having 6 to 12 carbon atoms or an alkenylcarbonyloxy group having 2 to 4 carbon atoms.

Furthermore, the $R^4$ group may have a substituent, such as a phenyl group, a biphenyl group, a naphthyl group, an anthryl group, a phenanthrenyl group, a pyrenyl group, a pyridyl group, a pyrazolyl group, a quinolyl group, a thiazolyl group, a benzothiazolyl group, an oxathiazolyl goup, an oxazolyl group or a benzoxazolyl group.

These groups may have a substituent R. The substituent R represents a hydroxy group, a cyano group, a halogen atom, a straight chain or branched alkyl group having 1 to 19 carbon atoms, a cycloalkyl group having 5 to 18 carbon atoms, an alkenyl group having 2 to 4 carbon atoms, an alkoxy group having 1 to 19 carbon atoms, an alkylcarbonyloxy group having 1 to 19 carbon atoms, a cycloalkylcarbonyloxy group having 6 to 12 carbon atoms, or an alkenylcarbonyloxy group having 2 to 4 carbon atoms.

Further, the substituent R represents a phenyl group, a biphenyl group or a naphtyl group. These groups may have a substituent, such as a hydroxy group, a cyano group, a halogen atom, a straight chain or branched alkyl group having 1 to 19 atoms, or an alkoxy group having 1 to 19 carbon atoms. $R^3$ represents hydrogen or a straight chain or branched alkyl group having 1 to 8 carbon atoms.

Still further examples of low molecular weight compounds as the electron moving and donating agent include vinylene compounds of formulae (24, (25) and (26):

 (24)

 (25)

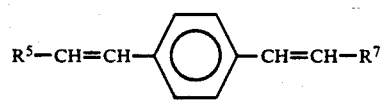 (26)

wherein each of $R^5$ and $R^7$ independently represents a group of the formula selected form the following formulae:

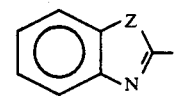 (27)

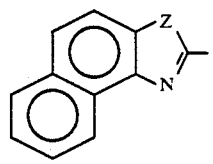 (28)

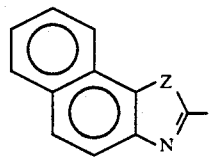 (29)

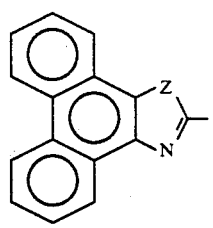 (30)

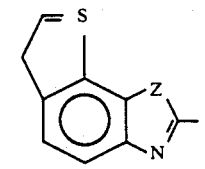 (31)

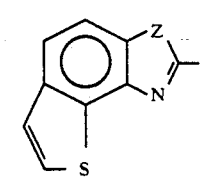 (32)

(33)

(34)

(35)

(36)

(37)

wherein at least one hydrogen atom of each of these groups may be substituted with a hydroxy group, a cyano group, a halogen atom, a straight chain or branched alkyl group having 1 to 8 carbon atoms, an alkyloxy group having 1 to 8 carbon atoms or alkylcarbonyloxy group having 1 to 8 carbon atoms, and Z represents O, S, Se, N—$R^8$ or C($R^8$)$R^9$. Each of $R^8$ and $R^9$ independently represents a straight chain or branched alkyl group having 1 to 8 carbon atoms.

In formula (24), $R^6$ represents a phenyl group, a biphenyl group, a naphthyl group, an anthryl group, a phenanthrenyl group or a pyrenyl group. $R^6$ may have a substituent, such as a hydroxy group, a cyano group, a halogen atom, a straight chain or branched alkyl group having 1 to 8 carbon atoms, an alkyloxy group having 1 to 8 carbon atoms, an alkylcarbonyloxy group having 1 to 19 carbon atoms, an alkenylcarbonyloxy group having 2 to 4 carbon atoms, a cycloalkylcarbonyloxy group having 6 to 12 carbon atoms, a cycloalkyl group having 5 to 18 carbon atoms, a dialkylamino group having 1 to 6 carbon atoms, a diphenylamino group, an oxazolyl group, or a thiazolyl group. Furthermore, $R^6$ may have a substituent, such as a phenyl group, a phenoxy group, a naphthyl group, a naphthyloxy group, an anthryl group or an anthryloxy group. These groups may have a substituent such as a cyano group, a nitro group, a halogen atom, or a straight chain or branched alkyl group having 1 to 8 carbon atoms.

Representative examples of $R^6$ and $R^7$ include nuclei of benzothiazoles, such as benzothiazole, 5-methylbenzothiazole, 6-methylbenzothiazole, 5,6-dimethylbenzothiazole, 5-tert-butylbenzothiazole, 5-bromobenzothiazole, 5-phenylbenzothiazole, 4'-methoxy-5-phenylbenzothiazole, 5-methoxybenzothiazole, 6-methoxybenzothiazole, 5,6-dimethoxybenzothiazole, 5,6-dioxymethylenebenzothiazole, 5-hydroxybenzothiazole, 6-hydroxybenzothiazol and dibenzo[e,g]benzothiazole.

Other examples of $R^5$ and $R^7$ include nuclei of naphthothiazoles, such as naphtho[2,1-d]thiazole, naphtho[1,2-d]thiazole, 5-ethylnaphtho[1,2-d]thiazole, 5-tert-butylnaphtho[1,2-d]thiazole, 5-phenylnaphtho-[1,2-d]thiazole, 5-methoxynaphtho[1,2-d]thiazole, 5-ethoxynaphtho[1,2-d]thiazole, 5-chloronaphtho[1,2-d]thiazole, 8-ethylnaphtho[2,1-d]thiazole, 7-ethylnaphtho-[2,1-d]thiazole, 8-tert-butylnaphtho[2,1-d]thiazole, 7-tert-butylnaphtho[2,1-d]thiazole, 8-methoxynaphtho[2,1-d]thiazole, 7-methoxynaphtho[2,1-d]thiazole, 8-phenylnaphtho[2,1-d]thiazole, 7-phenylnaphtho[2,1-d]thiazole, 8-chloro-naphtho[2,1-d]thiazole and 7-chloronaphtho[2,1-d]thiazole. Further examples of $R^5$ and $R^7$ include nuclei of thionaphthene[7,6-d]thiazoles, such as 7-methoxythionaphtheno[7,6-d]thiazole, and nuclei of benzoxazoles, such as benzoxazole, 5-methylbenzoxazole, 6-methylbenzoxazole, 5,6-dimethylbenzoxazole, 5-tertbutylbenzoxazole, 5-bromobenzoxazole, 5-phenylbenzoxazole, 4,-methoxy-5-phenylbenzoxazole, 5-methoxybenzoxazole, 6-methoxybenzoxazol, 5,6-dimethoxybenzoxazole, 5,6-dioxymethylenebenzoxazole, 5-hydroxybenzoxazole, 6-hydroxybenzoxazole and dibenzo[e,g]benzoxazole.

Still further examples of $R^5$ and $R^7$ include nuclei of naphthoxazoles, such as naphtho[2,1-d]oxazole, naphtho[1,2-d]oxazole, 5-ethylnaphtho[1,2-d]oxazole, 5-tert-butylnaphtho[1,2-d]oxazole, 5-phenylnaphtho[1,2-d]oxazole, 5-methoxy-naphtho[1,2-d]oxazole, 5-ethoxynaphtho-[1,2-d]oxazole, 5-chloronaphtho[1,2-d]oxazole, 8-ethylnaphtho[2,1-d]oxazole, 7-ethylnaphtho[2,1-d]-oxazole, 8-tert-butylnaphtho[2,1-d]oxazole, 7-tertbutylnaphtho[2,1-d]oxazole, 8-methoxynaphtho[2,1-d]oxazole, 7-methoxynaphtho[2,1-d]oxazole, 8-phenylnaphtho[2,1-d]-oxazole, 7-phenylnaphtho[2,1-d]oxazole, 8-chloronaphtho[2,1-d]oxazole and 7-chloronaphtho[2,1-d]oxazole.

Still further examples of $R^5$ and $R^7$ include nuclei of benzoselenazoles, such as benzoselenazole, 5-methylbenzoselenazole, 6-methylbenzoselenazole, 5,6-dimethylbenzoselenazole, 5-tert-butylbenzoselenazole, 5-bromobenzoselenazole, 5-phenylbenzoselenazole, 4'-methoxy-5-phenylbenzoselenazole, 5-methoxybenzoselenazole, 6-methoxybenzoselenazole, 5,6dimethoxybenzoselenazole, 5,6-dioxymethylenebenzoselenazole, 5-hydroxybenzoselenazole, 6-hydroxybenzoselenazole and dibenzo[e,g]benzoselenazole.

Still further examples of $R^5$ and $R^7$ include nuclei of naphthoselenazoles, such as naphtho[2,1-d]selenazole, naphtho[1,2-d]selenazole, 5-ethylnaphtho[1,2-d]selenazole, 5-tert-butylnaphtho[1,2-d]selenazole, 5-phenylnaphtho[1,2-d]selenazole, 5-methoxynaphtho[1,2-d]selenazole, 5-ethoxynaphtho[1,2-d]selenazole, 5-chloronaphtho[1,2-d]selenazole, 8-ethylnaphtho[2,1-d]selenazole, 7-ethylnaphtho[2,1-d]selenazole, 8-tertbutylnaphtho[2,1-d]selenazole, 7-tert-butylnaphtho[2,1-d]selenazole, 8-methoxynaphtho[2,1-d]selenazole, 7-methoxynaphtho[2,1d]selenazole, 8-phenylnaphtho[2,1-d]selenazole, 7-phenylnaphtho[2,1-d]selenazole, 8-chloronaphtho[2,1-d]selenazole and 7-chloronaphtho[2,1-d]selenazole.

Still further examples of $R^5$ and $R^7$ include nuclei of 2-quinolines, such as 2-quinoline, 6-methyl-2-quinoline, 6-phenyl-2-quinoline, 6-chloro-2-quinoline, 6-methoxy- 2-quinoline, 6-ethoxy-2-quinoline and 6-hydroxy-2-quinoline; nuclei of 4-quinolines, such as 4-quinoline, 6-methoxy-4-quinoline, 7-methyl-4-quinoline, 7-phenyl-4-quinoline and 8-methyl-4-quinoline; nuclei of 1-isoquinolines, such as 1-isoquinoline and 3,4-dihydroxy-1-isoquinoline; and nuclei of 3-isoquinolines, such as 3-isoquinoline.

Still further examples of R⁵ and R⁷ include nuclei of 3,3-dialkylindolenines, such as 3,3-dimethylindolenine, 3,3-dimethyl-5-chloroindolenine, 3,3,5-trimethylindolenine, 3,3,7-trimethylindolenine, 3,3-dimethyl-5-phenylindolenine, 3,3-dimethyl-benzo[e]indolenine, 3,3-dimethyl-benzo[g]indolenine and 3,3-dimethyl-dibenzo[e,g]indolenine.

Still further examples of R⁵ and R⁷ include nuclei of pyridines, such as pyridine, 5-methylpyridine, 5-phenylpyridine and 5-chloropyridine; nuclei of benzimidazoles, such as 1-ethyl-5,6-dichlorobenzimidazole, 1-ethyl-5-chlorobenzimidazole, 1-ethyl-5,6-dibromobenzimidazole, 1-ethyl-5-phenylbenzimidazole, 1-ethyl-5-cyanobenzimidazole, 1-ethyl(4,-ethyl)-5-phenylbenzimidazole, 1-ethyl-5-acetylbenzimidazole, 1-ethyl-5-ethoxycarbonylbenzoimidazole, 1-ethylbenzo[e]benzimidazole, 1-ethylbenzo[g]benzimidazole and 1-ethyl-dibenzo[e,g]benzimidazole.

Polymers for use as the electron moving and donating agent may have a main chain or a side chain containing a compound selected from the above-mentioned low molecular weight compounds for use as the electron moving and donating agent. For example, use is made of a polymer having a main chain or a side chain having a 1,3,4-oxadiazole unit.

Representative examples of polymers for use as the electron moving and donating agent include polyethers of formula (38), which is obtained from a dihalogen derivative of oxadiazole and a bisphenol compound,

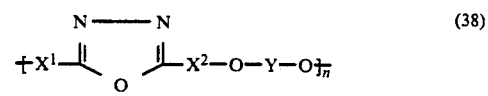   (38)

wherein each of X¹ and X² independently represents a phenylene group, a biphenylene group, a naphthylene group, an anthracenylene group, a phenanthrenylene group, a pyrenylene group or a pyridilene group. These groups may be substituted with a group, such as acyano group, a halogen atom, a straight chain or branched alkyl group having 1 to 8 carbon atoms and analkyloxy group having 1 to 8 carbon atoms, Y represents an aromatic group or an alkylene group having 1 to 20 carbon atoms, and n is an integer of 3 or more.

Representative examples of the aromatic group Y are:

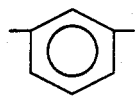 (39)　　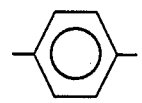 (40)

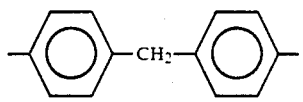 (41)　　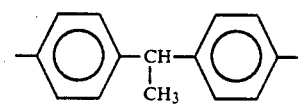 (42)

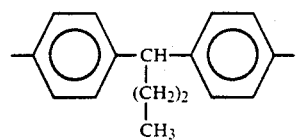 (43)　　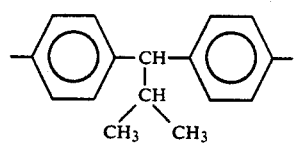 (44)

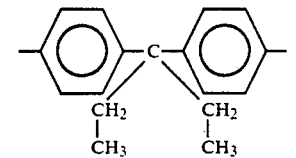 (45)　　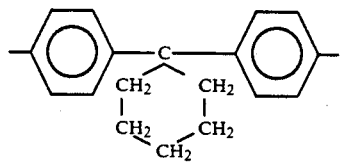 (46)

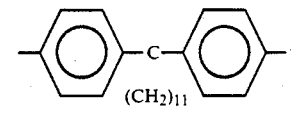 (47)　　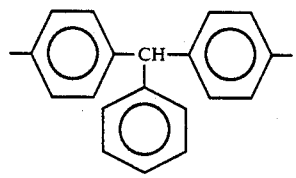 (48)

-continued
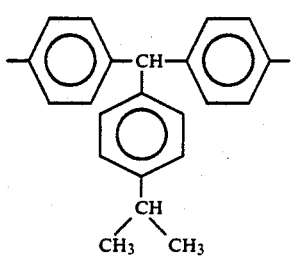 (49)
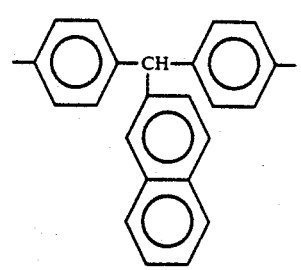 (50)
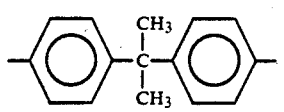 (51)
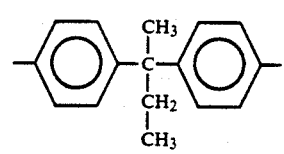 (52)
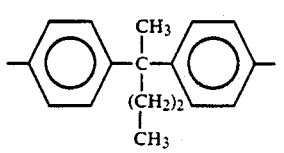 (53)
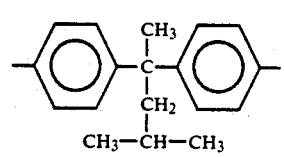 (54)
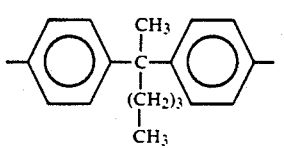 (55)
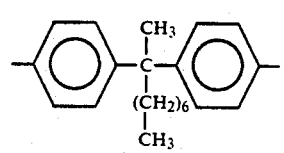 (56)
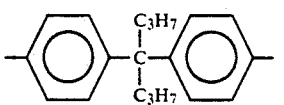 (57)
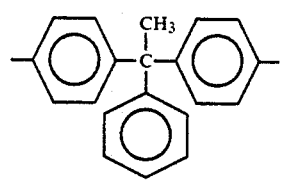 (58)
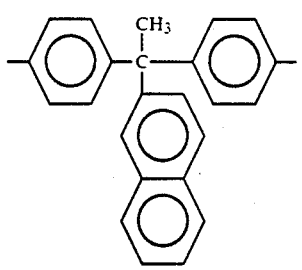 (59)
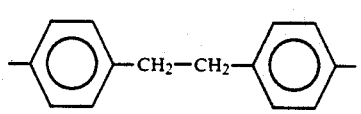 (60)
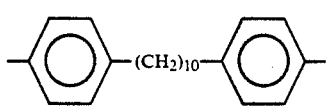 (61)
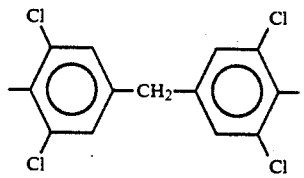 (62)
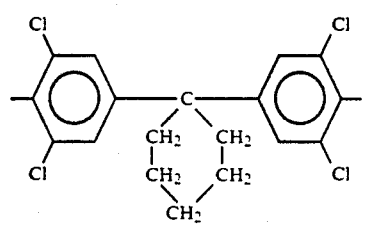 (63)
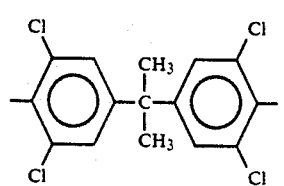 (64)

-continued
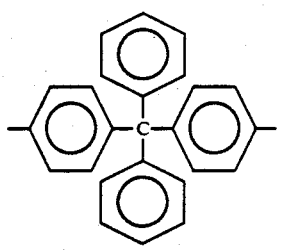 (65)
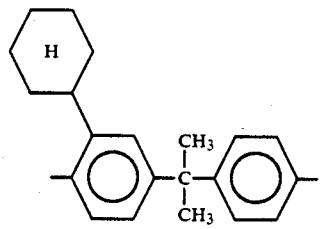 (66)
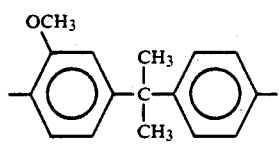 (67)
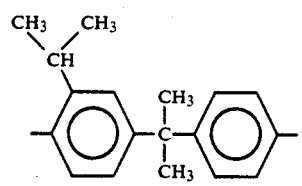 (68)
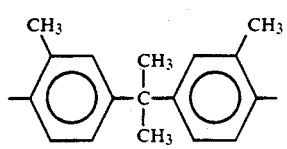 (69)
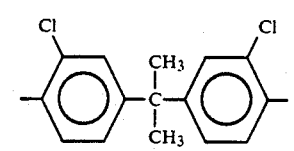 (70)
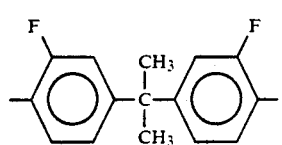 (71)
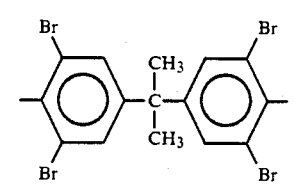 (72)
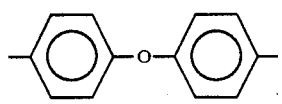 (73)
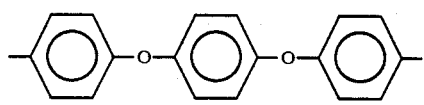 (74)
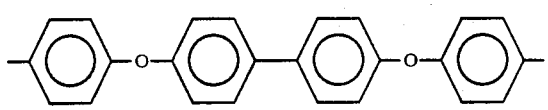 (75)
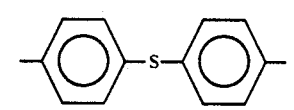 (76)
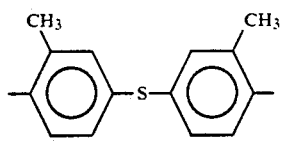 (77)
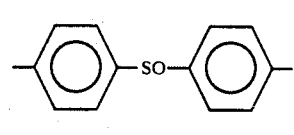 (78)
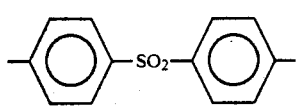 (79)
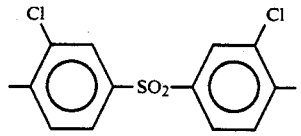 (80)
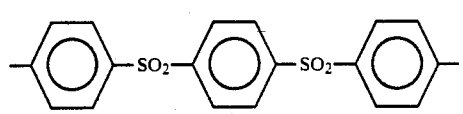 (81)
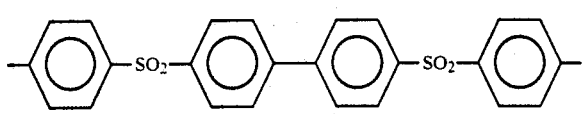 (82)

Other examples of polymers for use as the electron moving and donating agent include polyesters of formulae (98) and (99):

$$+OC-X^1-\underset{O}{\overset{N=N}{\|}}-X^2-COO-Y-O\}_n \quad (98)$$

$$+O-X^1-\underset{O}{\overset{N=N}{\|}}-X^2-OOC-Y-CO\}_n \quad (99)$$

wherein $X^1$, $X^2$, Y and n are as defined above.

Further examples of polymers include polycarbonates of formula (100):

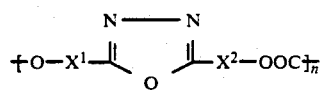
(100)

wherein $X^1$, $X^2$ and n are as defined above.

Still further examples of polymers include polyamides of formulae (101) and (102):

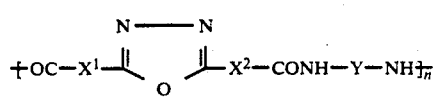
(101)

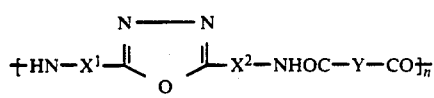
(102)

wherein $X^1$, $X^2$, Y and n are as defined above, and polyurethanes obtained from a bisphenol derivative of oxadiazole and a diisocyanate compound.

These polymers can be prepared according to the conventional condensation polymerization method. The prepared polymers may be purified by reprecipitation or the like before use.

Examples of polymers having a side chain having an oxadiazole unit include an ethylene polymer having a side chain having an oxadiazole unit, represented by formula (103)

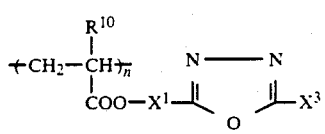
(103)

wherein $R^{10}$ represents an alkyl group having 1 to 3 carbon atoms, $X^1$ is as defined above, $X^3$ represents a phenyl group, a biphenyl group, a naphthyl group, an anthracenyl group, a phenanthrenyl group, a pyrenyl group or a pyridyl group, provided that these groups may have a substituent, such as a cyano group, a halogen atom, a straight chain or branched alkyl group having 1 to 8 carbon atoms or an alkyloxy group having 1 to 8 carbon atoms.

These polymers can be prepared by polymerizing an ethylene monomer having an oxadiazole unit in the side chain thereof, or by reacting an oxadiazole compound with an ethylene polymer.

Still further examples of polymers for use as the electron moving and donating agent include polymers having a side chain having a condensed polycyclic aromatic residue, represented by the formula selected from the following formulae:

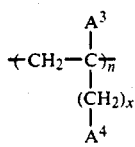
(104)

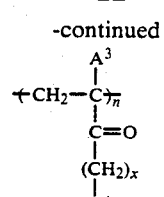
(105)

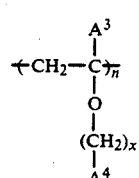
(106)

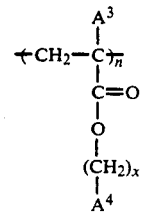
(107)

wherein $A^3$ represents a hydrogen atom or an alkyl group having 1 to 8 carbon atoms, $A^4$ represents an aromatic residue, x is an integer of from 0 to 6, and n is an integer of 3 or more.

Representative examples of aromatic residues represented by $A^4$ are:

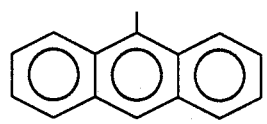
(108)

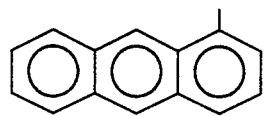
(109)

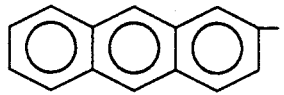
(110)

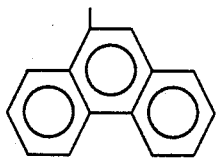
(111)

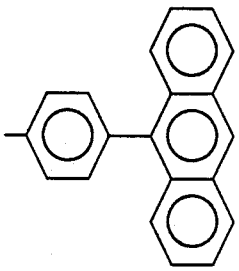
(112)

-continued

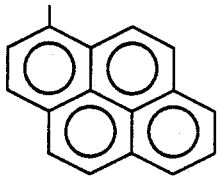
(113)

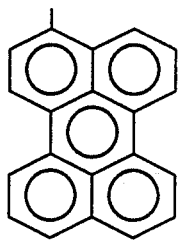
(114)

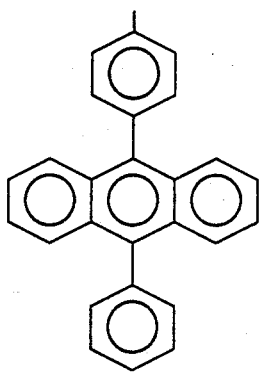
(115)

The above electron moving and donating agents may be used individually or in combination.

The fluorescent materials for use as the fluorescent luminescent agent in the present invention may be chosen from dyes for a dye laser, fluorescent brighteners and compounds capable of exhibiting fluorescence upon ultra-violet radiation, as described in for example, "Laser Dyes" written by M. Maeda (Published by Academic Press, 1984) and "Organic Luminescent Materials" written by B. M. Krasovitskii and B. M. Bolotin (Published by VCH, 1988).

Preferred examples of fluorescent materials with a low molecular weight include condensed polycyclic aromatic compounds, such as anthracene, pyrene, chrysene, perylene, coronene, 3,4-benzofluoranthene, 1,2-benzanthracene, 2,3-benzofluorene, 1,12-benzoperylene, 3,4-benzopyrene, 4,5-benzopyrene, 9-phenylanthracene, 9,10-bis(4-methoxyphenyl)anthracene, 1-chloro-9,10-diphenylanthracene, 9,10-diphenylanthracene, 4,5-methylenephenanthrene, decacyclene, 1,2:3,4-dibenzanthracene, 1,2:5,6-dibenzanthracene, periflanthene, 4,7-diphenyl-1,10-phenanthroline, fluoranthene, 3-methylcholanthrene, rubrene, triphenylene, benzo[g-hi]perylene and 4H-cyclopenta[def]phenanthrene; aromatic compounds, such as terphenyl, 1,3-diphenylisobenzofuran, 1,2,3,4-tetraphenyl-1,3-cyclopentadiene and pentaphenylcyclopentadiene; perylene derivatives as disclosed in for example, Japanese Patent Application Laid-Open Specification No. 2-189890; 6-propionyl-2-dimethylaminonaphthalene; and naphthalene derivatives as disclosed in Japanese Patent Application Laid-Open Specification No. 2-255789.

Other examples of low molecular weight fluorescent materials include fluorescent coumarin dyes, such as 7-hydroxy-4-methylcoumarin, 7-diethylamino-4-methylcoumarin, 7-dimethylaminocyclopenta[c-]coumarin, 1,2,4,5,-3H,6H,10H-tetrahydro-8-methyl[1-]benzopyrano[9,9a,1-gh]-quinolizin-10-one, 7-amino-4-trifluoromethylcoumarin, 1,2,4,5,3H,6H,10H-tetrahydro-9-cyano[1]benzopyrano[9,9a,1-gh]quinolizin-10-one, 1,2,4,5,3H,6H,10H-tetrahydro-9carbo-t-butoxy[1]benzopyrano[9,9a,1-gh]quinolizin-10-one, 7-ethylamino-6-methyl-4-trifluoromethylcoumarin, 1,2,4,5,3H,6H,10H-tetrahydro-9-carbethoxy[1]benzopyrano[9,9a,1-gh]quinolizin-10-one, 7-diethylamino-3-(1-methylbenzimidazolyl)coumarin, 7-dimethylamino-4-trifluoromethylcoumarin, 1,2,4,5,3H,6H,10H-tetrahydro-9-carboxy[1]benzopyrano[9,9a,1-gh]quinolizin-10-one, 1,2,4,5,3H,6H,10H-tetrahydro-9-acetyl[1]benzopyrano[9,9a,1-gh]quinolizin-10-one, 3(2-benzimidazolyl)-7-N, N-diethylaminocoumarin, 1,2,4,5,-3H,6H,10H-tetrahydro-8-trifluoromethyl[1]benzopyrano[9,9a,1-gh]quinolizin-10-one, 3-(2-benzothiazolyl)-7-diethylaminocoumarin, 7-diethylamino-4-trifluoromethylcoumarin, 2,3,6,7,-tetrahydro-9-(trifluoromethyl)-1H,5H,11H-[1]benzopyrano[6,7,8-ij]quinolizin-11-one, 7-amino-4-methylcoumarin and 4,6-dimethyl-7-etylaminocoumarin.

Further examples of low molecular weight fluorescent materials include xanthene dyes, for example, Rhodamine dyes, such as Rhodamine B, Rhodamine 6G, Rhodamine 6G perchlorate, Rhodamine 19 perchlorate, Rhodamine 101 inner salt, Rhodamine 110, Rhodamine 116 perchlorate, Rhodamine 123, Sulforhodamine B and Sulforhodamine 101, and fluorescein dyes, such as fluorescein and 2', 7'-dichlorofluorescein.

Still further examples of preferred low molecular weight fluorescent materials include styryl pigments, such as 2-(p-dimethylaminostyryl)quinoline, 2-(p-dimethylaminostyryl)benzoxazole, 4-(p-dimethylaminostyryl)quinoline, 2-(p-dimethylaminostyryl)-6-ethoxyquinoline, 2-(p-dimethylaminostyryl)benzothiazole, 2-(p-dimethylaminostyryl)naphtho[1,2-d]oxazole, 2-(p-dimethylaminostyryl)-3,3'-dimethyl-3H-indole, 2-(p-dimethylaminostyryl)naphtho[1,2-d]thiazole, 4-dicyanomethylene-6-(p-dimethylaminostyryl)-2-methyl-4H-pyran.

Still further examples of preferred low molecular weight fluorescent materials include pigments, such as those of polymethine type, oxazine type, xanthene type and cyanine type; aromatic amines; aromatic imines; butadienes, such as 1,1,4,4-tetraphenyl-1,3-butadiene, 1-(9-anthracenyl)-4-phenyl-1,3-butadiene and 1-(4-quinolyl)-4-(p-dimethylamino)phenyl-1,3-butadiene; acridines; stilbenes, such as 4,4'-bis(5-methyl-2-benzoxazolyl)stilbene; benzofurans, such as 1,3-isobenzofuran; compounds capable of exhibiting an excimer or exciplex fluorescence, such as 1,3-dipyrenylpropane, disclosed in Japanese Patent Application Laid-Open Specification No. 1-242879; benzoxadiazoles, such as 7-(p-methoxybenzylamino)-4-nitrobenzoxadiazole; fluorescent brighteners, such as an oxazole compound, an oxadiazole compound, a benzoimidazole compound and a thiazole compound; a metal complex, a ruthenium complex and a rare earth element complex of 8-hydroxyquinolines and their derivatives; fluoresent metal and rare earth element complexes, as represented by europium complexes, of benzoyltrifluoroacetone, furoyltrifluoroacetone and hexafluoroacetone; and a rare earth metal salt, such as terbium picolinate. Further, those described as being useful fluorescent materials in Japanese Patent Application Laid-Open Specification No. 63-264692 can also be employed.

Examples of high molecular weight fluorescent materials include polymers having, at its main chain, side chain or terminals, the above-mentioned low molecular weight fluorescent material.

In the electroluminescent element of the present invention, the organic luminescent layer comprises a mixture of at least one fluorescent luminescent agent, at least one hole moving and donating agent and at least one electron moving and donating agent. To attain a high luminescence efficiency, it is required to employ an appropriate combination of these component agents. When the combination of these component agents is not appropriate, it is likely that only faint luminescence results from the hole moving and donating agent and the electron moving and donating agent, or no luminescence is obtained at all without the luminescence from the luminescent agent.

In the electroluminescent element of the present invention, luminescence is attained by the recombination, at the luminescent agent which serves as the hole-electron recombination center, of the holes having been moved and donated to the luminescence center by the action of the hole moving and donating agent with the electron having been moved and donated to the luminescence center by the action of the electron moving and donating agent.

The present inventors have found that the luminescence from the luminescent agent is attained at high efficiency when the ionization potential of the fluorescent luminescent agent is equal to or less noble relative to the ionization potential of the hole moving and donating agent and when the electron affinity of the fluorescent luminescent agent for electrons is equal to or noble relative to the electron affinity of the electron moving and donating agent for electrons.

For efficiently moving holes, it is desired that the ionization potential of the hole moving and donating agent be equal to or less noble relative to the ionization potential of the electron moving and donating agent. On the other hand, for efficiently moving electrons, it is desired that the affinity of the electron moving and donating agent for electrons be equal to or noble relative to the affinity of the hole moving and donating agent for electrons. When the above-mentioned relationships are not satisfied, it is likely that the hole moving and donating agent and the electron moving and donating agent act as traps for holes and electrons, respectively, thereby lowering the hole mobility and electron mobility.

The ionization potential and electron affinity (affinity for electrons) of each component compound of the mixture of the hole moving and donating agent, the electron moving and donating agent and the luminescent agent can be, respectively, determined based on the first oxidation potential and first reduction potential of each component compound, as measured in a solution of the component for a solvent thereof. Using the first oxidation potential and the first reduction potential as criteria, the individual component compounds can be appropriately selected for combination.

Thus, a certain compound to be used as a component of the above-mentioned mixture, can also be used as another component by appropriately choosing types of other component compounds to be combined therewith. For example, a fluorescent compound capable of moving electrons is used as the electron moving and donating agent in a certain combination of component compounds, and also used as the luminescent agent in another combination of component compounds.

The first oxidation potential and the first reduction potential of each component compound with respect to a solution thereof in a solvent for the component can be determined by the conventional cyclic voltammetry technique. Illustratively stated, the measurement of the first oxidation potential and the first reduction potential of each component compound is performed at 25° C. in a solution of the compound in a solvent for the compound, for example, in an acetonitrile solution containing the compound at a concentration of $1 \times 10^{-4}$ to $1 \times 10^{-6}$ mole/liter, using 0.1 mole/liter tetra-n-butylammonium perchlorate as a supporting electrolyte. A silver-silver chloride electrode is used as a reference electrode, a platinum electrode is used as an opposite electrode, and a glassy carbon electrode is used as a working electrode. Using a potentiostat (HA-303 manufactured and sold by HOKUTO DENKO LTD., Japan) and a function generator (HB-104 manufactured and sold by HOKUTO DENKO LTD., Japan), the working electrode is subjected to potential sweeping in the above-mentioned solution at a sweep rate corresponding to a triangular wave of $10 \text{ mV} \cdot \text{S}^{-1}$, thereby determining a current-potential curve. In the operation, when a reduction potential is to be measured, the potential sweep is conducted between a starting potential of 0 V and a turning potential of $-2.5$ V, and when an oxidation potential is to be measured, the potential sweep is conducted between a starting potential of 0 V and a turning potential of $+2.5$. Before the measurement, nitrogen gas is blown into the solution for 15 minutes so as to remove any oxygen dissolved therein.

On the potential-current curve obtained by the above-mentioned procedure, the potential (half wave potential) corresponding to a half of a peak exhibiting a maximum current is taken as an oxidation potential or a reduction potential (provided that when the current value at the potential at which the current starts to change drastically is not zero, the current value is subtracted from the peak current value). When the measurement is conducted with respect to a compound which cannot be dissolved in acetonitrile, other suitable solvents, such as dimethylformamide, dimethyl sulfoxide or the like is used as a solvent instead of acetonitrile.

In the selection of an appropriate combination of component compounds for the luminescent layer, important are not the absolute values of the oxidation potential and reduction potential of the compounds, but the relative values of the oxidation potential and reduction potential of the compounds. Therefore, the method for measuring the oxidation potential and the reduction potential is not particularly limited as long as the individual component compounds to be used in combination are measured with respect to the oxidation potential and the reduction potention under the same conditions.

There is no particular limitation with respect to the amounts of the luminescent agent, the hole moving and donating agent and the electron moving and donating agent in the luminescent layer. However, in general, the amount of the luminescent agent is preferably 0.01 to 20 parts by weight, more preferably 0.01 to 10 parts by weight, based on 100 parts by weight of the total of the hole moving and donating agent and the electron moving and donating agent. The weight ratio of the electron moving and donating agent to the hole moving and donating agent is 95:5 to 5:95. When the amount of the luminescent agent is less than 0.01 part by weight, based on 100 parts by weight of the total of the hole moving and donating agent and the electron moving and donating agent, a high luminescence efficiency cannot be obtained due to too low a concentration thereof. Further, when the amount of the luminescent agent is more than 20 parts by weight, also, a high luminescence efficiency cannot be obtained due to concentration quenching.

In addition to the essential components, i.e., the luminescent agent, the hole moving and donating agent and the electron moving and donating agent, the luminescent layer may further optionally comprise a binder polymer when the luminescent layer is formed from a solution by a coating method. Examples of binder polymers include solvent-soluble resins, such as polyvinyl chloride, a polycarbonate, polystyrene, polymethyl methacrylate, polybutyl methacrylate, a polyester, a polysulfone, polyphenylene oxide, polybutadiene, a hydrocarbon resin, a ketone resin, a phenoxy resin, a polyamide, ethylcellulose, vinyl acetate, ABS resin, and a polyurethane resin; and curable resins, such as a phenol resin, a xylene resin, a petroleum resin, a urea resin, a melamine resin, an unsaturated polyester resin, an alkyd resin, an epoxy resin, and a silicone resin.

When a binder polymer is used, the amount thereof is preferably up to 1 part by weight per one part by weight of the total of a fluorescent luminescent agent, a hole moving and donating agent and an electron moving and donating agent. When the binder polymer is used in an amount of greater than 1 part by weight, the ability to move holes and electrons is lowered, thereby causing high luminescence efficiency to be unattainable.

The thickness of the organic luminescent layer is generally in the range of from 50 Å to 1 μm. It is preferred however that the thickness do not exceed 5000 Å.

To form the electroluminescent element of the present invention, an organic layer as a luminescent layer is formed on an anode, and further a cathode is formed thereon, and vice versa. The luminescent layer may be formed by vapor deposition of component compounds, or alternatively may be formed by coating of a solution of component compounds containing a binder polymer if desired, followed by drying. When the luminescent layer is formed by coating of a solution, the coating may be performed by the conventional coating methods, such as a casting method, a blade coating method, a dip coating method, a spin coating method, a spray coating method and a roll coating method. Especially, when the luminescent layer is formed by coating of a solution followed by drying, it is preferred that after coating on an electrode preferably disposed on a supporting body, leveling of the coated solution be performed in a solvent vapor at the time of drying, in order to obtain an element capable of uniform light emission.

An electroluminescent element capable of uniform light emission which exhibits a statistical brightness dispersion (scattering of brightness values from their average) of 5% or less relative to the average brightness in a single element has excellent durability in continuous light emission. The brightness dispersion is determined as follows. First, brightness is measured on at least two portions of a brightening surface of an electroluminescent element whose area is defined by the area of an anode or a cathode whichever is smaller, using a brightness meter having a measuring area of 0.1 mm in diameter. Second, an arithmetic mean of all measured values is calculated. Third, the difference between the maximum value and the arithmetic mean and the difference between the minimum value and the arithmetic mean are calculated. The differences are compared, and the percentage of the larger difference to the arithmetic mean is calculated, which is defined as the brightness dispersion.

It is desired that the organic luminescent layer of the element according to the present invention, irrespective of the preparation method as described above, exhibit a photoelectric work function of from 5.0 to 6.0 eV, which work function is determined by means of a low energy electron spectrometer after formation of a luminescent layer followed by processing, such as drying, if desired. The value of the photoelectric work function is an index of the electron state of the luminescent layer. If the value of the photoelectric work function changes as much as 0.2 eV or more when the luminescent layer is allowed to stand for one or more days after the formation of the layer, the number of non-luminescent points in the luminescent layer increases, leading to a lowering of the quality of the layer as a surface luminescent light source The presumed reason is that crystallization, phase separation and/or change of compounds occurs in the luminescent layer due to the lapse of time, thereby changing the electron state thereof. The measuring of the photoelectric work function is effective as a nondestructive testing means at the time of manufacturing.

The photoelectric work function of the luminescent layer is determined as follows. Excitation energy is applied to the layer, and the energy is increased 0.05 eV from 4.40 eV to 6.2 eV, using a surface analyzer (AC-1; manufactured and sold by Riken Keiki Co., Ltd.) in an atmosphere of 25° C.-50% RH. The number of photoelectrons at each energy level is measured. The root of the number of photoelectrons is set on a vertical axis and the excitation energy is set on a horizontal axis of Cartesian coordinates. The work function is determined as an intercept of the straight line drawn according to the least square method with the horizontal axis.

In the present invention, the anode is comprised of a transparent or an opaque conductive material formed on an insulating support. When the cathode is opaque, the anode must be transparent. Preferred examples of conductive materials include conductive oxides, such as tin oxide, indium oxide and indium tin oxide (ITO); metals, such as gold, silver and chromium; inorganic conductive materials, such as copper iodide and copper sulfide; and conductive polymers, such as polythiophene, polypyrrole and polyaniline.

Preferably used as a cathode in the present invention is a transparent, semitransparent or opaque electrode comprised of a metal, such as lithium, indium, silver, aluminum, lead, magnesium, copper, lanthanum, europium and ytterbium, a rare earth element or a complex thereof.

In the electroluminescent element of the present invention, a hole injecting and transporting layer and/or a hole inhibiting layer may be provided in addition to the above-mentioned luminescent layer.

The hole injecting and transporting layer is provided between the anode and the luminescent layer so as to facilitate the injection of holes from the anode, and further to transport the injected holes to the luminescent layer. The layer may be comprised of a compound used as the hole moving and donating agent or a P-type inorganic semiconductor, such as Si, $Si_{1-x}C_x$ wherein x is 0.1 to 0.9, CuI and ZnTe each in an amorphous or a microcrystalline form. When the anode is transparent, it is preferred that the layer be permeable for light generated in the luminescent layer.

The hole inhibiting layer is provided between the organic luminescent layer and the cathode, and inhibits passage of holes into the cathode to hold the holes within the organic luminescent layer, thereby permitting the holes to effectively contribute to luminescence. An arbitrary electron transporting compound can be used in the formation of the hole inhibiting layer. However, it is preferred that the first oxidation potential of the compound used as the hole inhibiting layer be equal to or noble relative to the first oxidation potential of the hole transporting and donating agent used in the luminescent layer, from the viewpoint of obtaining higher performances of the electroluminescent element.

Examples of electron transporting compounds to be used for formation of the hole inhibiting layer include all organic compounds and metal complexes which can be used as the electron moving and donating agent in the present invention, and further include n-type inorganic semiconductors, such as CdS, CdSe, CdTe, znO, ZnS, ZnSe, ZnTe (n-type), $Si_{1-x}C_x$ wherein x is 0.1 to 0.9, monocrystalline silicon and amorphous silicon.

The hole injecting and transporting layer and the hole inhibiting layer may be comprised of an appropriate compound per se or in the form of a dispersion of an appropriate compound in a binder resin. The layers may be formed by vapor deposition, spattering, or an electrolytic reaction, or may be formed by coating. The binder resin is selected from conventional polymers, such as a polycarbonate, polyvinyl chloride, polystyrene, a polyester, a polysulfone, polyphenylene oxide, a polyurethane, an epoxy resin and polysilane. The amount of added binder resin is not particularly limited. However, it is generally up to 100 parts by weight per part by weight of the compound.

Each of the hole injecting and transporting layer and the hole inhibiting layer does not necessarily consist of one layer, and two or more sub-layers may be laminated to constitute each of the layers. The thickness of each of the layers is preferably in the range of from 50 Å to 1 μm.

The electroluminescent element of the present invention may be driven by a direct current power source. Alternatively, in order to ensure light emission at high brightness for a prolonged period of time, it may be driven by an alternating current. With respect to the waveform of the alternating current signal, not only sine waveform but also any arbitrary alternating current waveform, such as a rectangular waveform, a triangular waveform and waveforms obtained by combining or synthesizing them, can be employed in the present invention.

The electroluminescent element of the present invention finds applications in surface luminous light sources, such as a backlight of a liquid crystal display, an erasing light source for a copying machine, and a pilot lamp of a meter; various types of display devices, such as a flat panel display of a flat television and a display mounted on an automobile; and other general uses wherein conventional luminescent elements are used, such as a direction indicator and a tail lamp for use in a bicycle, a watch dial light, a luminescent device of a toy, a surface luminescent light source for advertisement, and a night pilot lamp for road construction.

PREFERRED EMBODIMENTS OF THE INVENTION

The present invention will now be further illustrated in more detail with reference to the following Examples, which should not be construed to be limiting the scope of the present invention.

EXAMPLE 1

ITO glass (manufactured and sold by HOYA Corp., Japan), which is a glass substrate prepared by forming an ITO film having a thickness of 1000 Å on a glass plate of 100×100×1.1 mm in size, is subjected to ultrasonic washing in acetone, followed by air-drying, and then washed with an ultraviolet washing apparatus [model PL-10-110; manufactured and sold by Sen Engineering Co., Ltd., Japan] for 5 minutes. On the ITO glass, a luminescent layer is formed in a thickness of 1000 Å by dip coating of a 1,2-dichloroethane solution containing 1 part by weight of poly(N-vinylcarbazole) (hereinafter simply referred to as PVK, having a first oxidation potential of +1.06 V and a first reduction potential which is less noble as compared to −2.5; Luvican M170 manufactured and sold by BASF A.G., Germany) as a hole moving and donating agent, 1 part by weight of 2-(4′-tert-butylphenyl)-5-(4″-biphenyl)-1,3, 4-oxadiazole (hereinafter simply referred to as butyl-PBD; having a first oxidation potential of +1.76 V and a first reduction potential of -2.04 V; manufactured and sold by Dojindo Laboratories, Japan) as an electron moving and donating agent and 0.02 part by weight of 3-(2 -benzimidazolyl)-7-N,N-diethylaminocoumarin (hereinafter simply referred to as coumarin 7; having a first oxidation potential of +0.86 V and a first reduction potential of −2.01 V) as a fluorescent luminescent agent.

Further, on the layer, metallic magnesium is vapor-deposited through a shadow mask in an area of 0.1 cm$^2$ to from a cathode defining the area of the element. Direct current voltage is applied to the thus prepared element using ITO glass as an anode. As a result, green light is emitted. Brightness thereof is 200 cd/m$^2$ at 21 V and 10 mA/cm$^2$.

The hole mobility of poly(N-vinylcarbazole) at $1\times10^5$ V/cm is $1.3\times10^{-7}$ cm$^2$/V·sec, and the hole mobility of the luminescent layer is $7.0\times10^{-8}$ cm$^2$/V·sec. Further, the photoelectric work function of the luminescent layer is 5.66 eV.

COMPARATIVE EXAMPLE 1

An element having a luminescent layer of 1000 Å in thickness is prepared by dip coating a 1,2-dichloroethane solution containing 2 parts by weight of PVK and 0.02 parts by weight of coumarin 7 according to substantially the same procedure as described in Example 1, except that butyl-PBO as an electron moving and donating agent is not used. The prepared element needs at least a voltage of 40 V for flowing a current of 10 mA/cm$^2$, at which the brightness is only 20 cd/m$^2$.

COMPARATIVE EXAMPLE 2

An element having a luminescent layer of 1000 Å in thickness is prepared using a 1,2-dichloroethane solution containing 1 part by weight of polyester resin (Vylon-200, manufactured and sold by Toyobo Co., Ltd., Japan) as a binder polymer, 1 part by weight of butyl-PBD as an electron moving and donating agent and 0.02 part by weight of coumarin 7 as a fluorescent luminescent agent according to substantially the same procedure as described in Example 1, except that PVK as a hole moving and donating agent is not used. In the prepared element, an electric current can flow only at a current density of 1 mA/cm$^2$ even if a voltage of 38 V is applied, at which the brightness is only 2 cd/m$^2$ Applying more voltage results in destruction of the element.

As is apparent from the above results, high luminescence efficiency cannot be obtained by the use of a mixture consisting only of a hole moving and donating agent and a fluorescent luminescent agent or a mixture consisting only of an electron moving and donating agent and a fluorescent luminescent agent.

COMPARATIVE EXAMPLE 3

An element is prepared according to substantially the same procedure as described in Example 1, except that 0.02 part by weight of 1,2,3,4,5,3H,6H,10H-tetrahydro-8-methyl[1]benzopyrano-(9,9a,1-gh)quinolizin-10-one (coumarin 102) having a first oxidation potential of +0.65 V and a first reduction potential of −2.15 V is used as a fluorescent luminescent agent, instead of coumarin 7. The prepared element emits a blue light, the brightness of which is only 3 cd/m$^2$ at a voltage of 30 V and a current density of 10 mA/cm$^2$.

COMPARATIVE EXAMPLE 4

An element is prepared according to substantially the same procedure as decribed in Example 1, except that 0.02 part by weight of 7-amino-4-trifluoromethyl-coumarin (coumarin 151) having a first oxidation potential of +1.18 V and a first reduction potential of −1.55 V is used as a fluorescent luminescent agent, instead of coumarin 7. The prepared element emits a blue light, the brightness of which is only 4 cd/m$^2$ at a voltage of 20 V and a current density of 10 mA/cm$^2$.

As is apparent from the above results, even if an element comprises a mixture of a hole moving and donating agent, a fluorescent luminescent agent and an electron moving and donating agent, high luminescence efficiency cannot be obtained when the first reduction potential of the fluorescent lumnescent agent is less noble relative to that of the electron moving and donating agent, or when the first oxidation potential of the fluorescent luminescent agent is noble relative to that of the hole moving and donating agent.

EXAMPLES 2 TO 16

Various types of electron moving and donating agents

In the following Examples, elements are separately prepared according to substantially the same procedure as described in Example 1, except that poly(N-vinylcarbazole) is used as a hole moving and donating agent, 3-(2'-benzothiazolyl)-7-diethylaminocoumarin (coumarin 6) having a first oxidation potential of 0.95 V and a first reduction potential of −1.67 V is used as a flouorescent luminescent agent and each of the compounds indicated below is individually used as an electron moving and donating agent. The weight proportions of PVK: the electron moving and donating agent: coumarin 6 are 90:10:1 in Examples 2 to 4, and 55:45:1 in Examples 5 to 16. All of the elements emit a green light. The voltages required to drive the elements at a current density of 10 mA/cm$^2$ and the brightnesses at those voltages, as well as the oxidation and reduction potentials of the electron moving and donating agents and the photoelectric work functions of the luminescent layers, are shown in Table 1.

Example 2: perylene
Example 3: fluoranthene
Example 4: benzo[ghi]perylene
Example 5: 2,5-bis(1-napthyl)-1,3,4-oxadiazole Example 6:
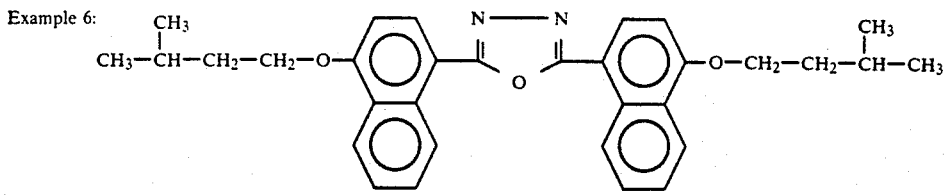

Example 7:
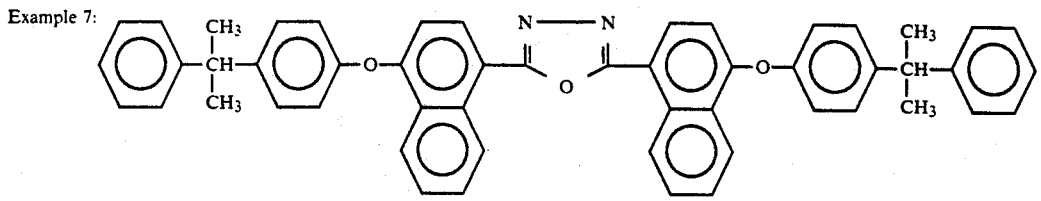

Example 8:
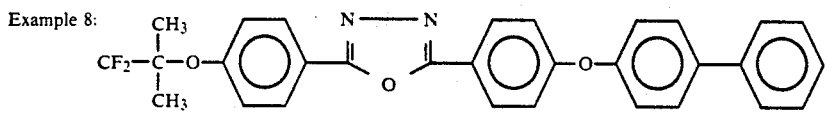

Example 9: 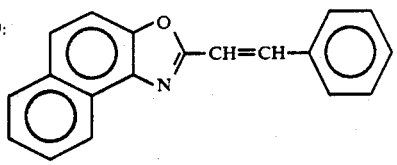
Example 10: 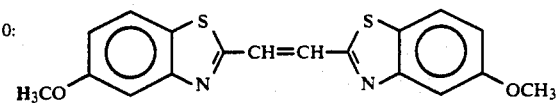
Example 11: 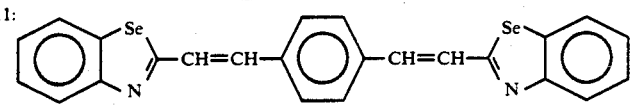
Example 12: 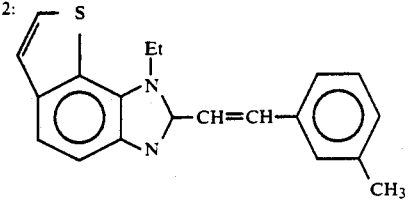
Example 13: 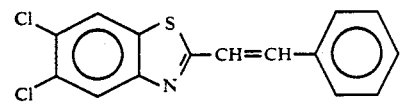
Example 14: 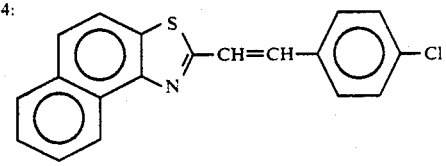
Example 15: 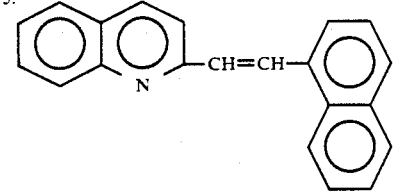
Example 16: 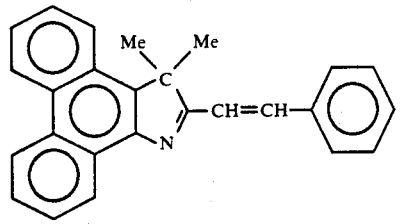
Example 17: 1,4-bis[2-(5-phenyloxazolyl)]benzene
TABLE 1
| Example Nos. | 1st oxidation potential (V) | 1st reduction potential (V) | Photoelectric work function (eV) | Voltage (V) | Brightness (cd/m$^2$) |
|---|---|---|---|---|---|
| 2 | +0.92 | −1.72 | 5.57 | 17 | 180 |
| 3 | +1.50 | −1.79 | 5.48 | 15 | 200 |
| 4 | +1.17 | −1.90 | 5.52 | 16 | 190 |
| 5 | +1.64 | −1.85 | 5.66 | 13 | 150 |

TABLE 1-continued

| Example Nos. | 1st oxidation potential (V) | 1st reduction potential (V) | Photoelectric work function (eV) | Voltage (V) | Brightness (cd/m$^2$) |
|---|---|---|---|---|---|
| 6 | +1.60 | −1.85 | 5.66 | 18 | 230 |
| 7 | +1.50 | −1.85 | 5.64 | 18 | 250 |
| 8 | +1.44 | −1.86 | 5.65 | 14 | 210 |
| 9 | +1.66 | −1.79 | 5.48 | 10 | 80 |
| 10 | +1.27 | −1.70 | 5.46 | 13 | 52 |
| 11 | +1.12 | −1.83 | 5.52 | 13 | 45 |
| 12 | +1.02 | −1.72 | 5.68 | 13 | 46 |
| 13 | +1.64 | −1.71 | 5.57 | 11 | 36 |
| 14 | +1.27 | −1.70 | 5.48 | 12 | 80 |
| 15 | +1.32 | −1.72 | 5.75 | 13 | 35 |
| 16 | +1.10 | −1.69 | 5.85 | 15 | 65 |
| 17 | +1.40 | −1.80 | 5.68 | 17 | 145 |

EXAMPLES 18 TO 21

Luminescent layers each having a thickness of 1500 Å are formed onto ITO glass treated in the same manner as described in Example 1, by vacuum deposition, individually using the compounds indicated below as a hole moving and donating agent, 2,5-bis(1-napthyl)-1,3,4-oxadiazole and 2,5-bis(2-naphthyl)-1,3,4-oxadiazole each having a first oxidation potential of +1.64 V and a first reduction potential of −1.85 V as electron moving and donating agents and 2-(p-dimethylaminostyryl)-naphtho[1,2-d]thiazole (hereinafter referred to as "NK-1886") having a first oxidation potential of +0.51 V and a first reduction potential of −1.83 V as a fluorescent luminescent agent. The temperatures of the boats of the vacuum deposition apparatus respectively containing the above-mentioned agents therein are regulated at a vacuum of 3×10$^{-6}$ Torr so that the weight proportions of the hole moving and donating agent: one of the electron moving and donating agents: the other of the electron moving and donating agents: the fluorescent luminescent agent are 50:25:25:1. The respective elements are examined in the same manner as described in Example 1. All of these elements emit a green light. The voltage values required to drive the elements at a current density of 10 mA/cm$^2$ and the brightnesses thereat, as well as the oxidation and reduction potentials of the hole moving and donating agents and the photoelectric work functions of the luminescent layers, are shown in Table 2.

Example 18: N,N'-diphenyl-N,N'-di(3-methylphenyl)-1,1'-biphenyl-4,4'-diamine
Example 19: α-(4-methoxyphenyl)-4-N,N-diphenylamino(4'-methoxy)stilbene
Example 20: 1-phenyl-3-(p-diethylaminostyryl)-5-(p-diethylaminophenyl)-2-pyrazoline
Example 21: p-diethylamino benzaldehyde diphenylhydrazone

TABLE 2

| Example Nos. | 1st oxidation potential (V) | 1st reduction potential (V) | Photoelectric work function (eV) | Voltage (V) | Brightness (cd/m$^2$) |
|---|---|---|---|---|---|
| 18 | +0.65 | −1.87 | 5.48 | 18 | 200 |
| 19 | +0.75 | — | 5.53 | 18 | 190 |
| 20 | +0.52 | — | 5.38 | 15 | 170 |
| 21 | +0.55 | — | 5.79 | 17 | 75 |

EXAMPLE 22

An electroluminescent element is prepared in substantially the same manner as in Example 1 except that a luminescent layer having a thickness of 1000 Å is formed from a chloroform solution containing 1 part by weight of N-isopropylcarbazole (first oxidation potential: +1.06 V, first reduction potential: less noble as compared to −2.5 V) as a hole moving and donating agent, 1 part by weight of a polyether (first oxidation potential: +1.50 V, first reduction potential: −1.85 V) obtained from 2,5-bis(4,4'-difluoro-1-naphthyl)-1,3,4-oxadiazole and 2,2-bis(4-hydroxyphenyl)propane (bisphenol A) as an electron moving and donating agent, and 0.02 part by weight of coumarin 6 as a luminescent agent. The thus obtained element exhibits a green luminescence having a brightness of 460 cd/m$^2$ at 12 V and 10 mA/cm$^2$.

EXAMPLE 23

An electroluminescent element is prepared in substantially the same manner as in Example 22 except that 1 part by weight of a polyether (first oxidation potential: +1.50 V, first reduction potential: −1.85 V) obtained from 2,5-bis(4,4'-difluoro-1-naphthyl)-1,3,4-oxadiazole and 1,1-bis(4-hydroxyphenyl)cyclohexane (bisphenol Z), is used as an electron moving and donating agent, and 0.02 part by weight of perylene is used as a luminescent agent. The thus obtained element exhibits a blue luminescence having a brightness of 300 cd/m$^2$ at 18 V and 40 mA/cm$^2$.

EXAMPLE 24

An electroluminescent element is prepared in substantially the same manner as in Example 22 except that 5 parts by weight of N,N'-diphenyl-N,N'-di(3-methylphenyl)-1,1'-biphenyl-4,4'-diamine is used as a hole moving and donating agent, 95 parts by weight of a polyether (first oxidation potential: +1.78 V, first reduction potential: −1.98 V) represented by the formula (127):

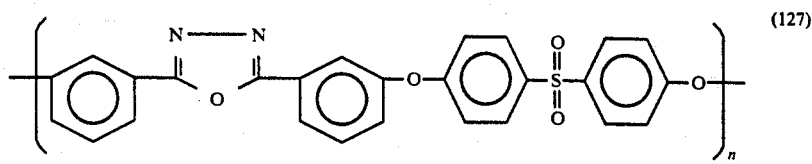

is used as an electron moving and donating agent, and 5 parts by weight of NK-1886 is used as a luminescent agent. The thus obtained element exhibits a green luminescence having a brightness of 200 cd/m$^2$ at 16 V and 12 mA/cm$^2$.

EXAMPLE 25

An electroluminescent element is prepared in substantially the same manner as in Example 22 except that 1 part by weight of N-phenylcarbazole is used as a hole moving and donating agent, 1 part by weight of a polyester (first oxidation potential: +1.98 V, first reduction potential: −1.91 V) obtained from 4,4′-dihydroxydiphenyloxadiazole derivative and decanedicarboxyl chloride and represented by the formula (128):

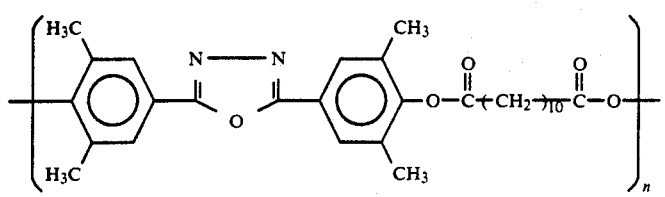

is used as an electron moving and donating agent, and 0.01 part by weight of coumarin 6 is used as a luminescent agent. The thus obtained element exhibits a green luminescence having a brightness of 520 cd/m² at 13 V and 10 mA/cm².

EXAMPLE 26

An electroluminescent element is prepared in substantially the same manner as in Example 22 except that 1 part by weight of a polycarbonate (first oxidation potential: +1.96 V, first reduction potential: −1.90 V) represented by the formula (129):

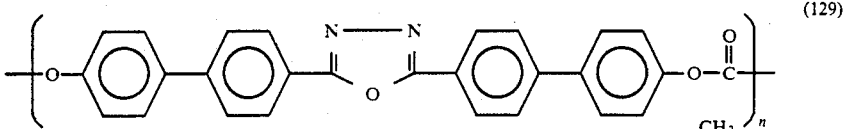

is used as an electron moving and donating agent. The thus obtained element exhibits a green luminescence having a brightness of 550 cd/m² at 10 V and 10 mA/cm².

EXAMPLE 27

An electroluminescent element is prepared in substantially the same manner as in Example 22 except that 1 part by weight of a polyamide (first oxidation potential: +1.71 V, first reduction potential: −1.87 V) represented by the formula (130):

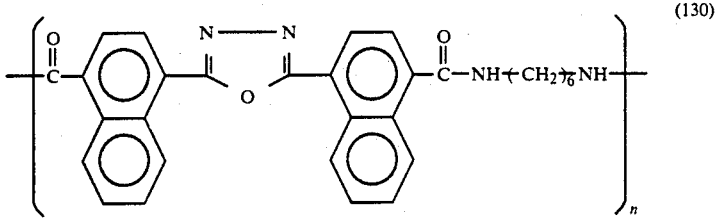

is used as an electron moving and donating agent. The thus obtained element exhibits a green luminescence having a brightness of 200 cd/m² at 13 V and 10 mA/cm².

EXAMPLE 28

An electroluminescent element is prepared in substantially the same manner as in Example 22 except that 95 parts by weight of PVK is used as a hole moving and donating agent, 5 parts by weight of the polyether which is the same as used in Example 22 is used as an electron moving and donating agent, and 1 part by weight of coumarin 6 is used as a luminescent agent. The thus obtained element exhibits a green luminescence having a brightness of 260 cd/m² at 17 V and 15 mA/cm².

EXAMPLE 29

An electroluminescent element is prepared in substantially the same manner as in Example 22 except that 1 part by weight of a polymer (first oxidation potential: +1.69 V, first reduction potential: −1.91 V) represented by the formula (131):

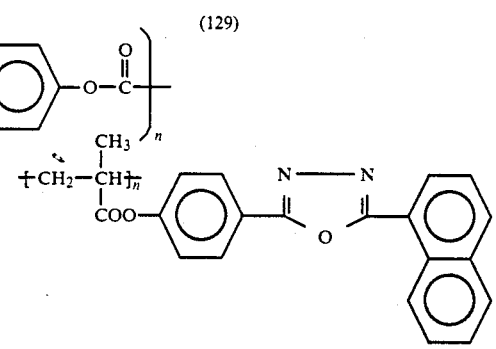

is used as an electron moving and donating agent. The thus obtained element exhibits a green luminescence having a brightness of 450 cd/m² at 12 V and 10 mA/cm².

EXAMPLE 30

An electroluminescent element is prepared in substantially the same manner as in Example 22 except that 1 part by weight of 2,5-bis(4-diethylaminophenyl)-1,3,4-oxadiazole (first oxidation potential: +0.75 V, first reduction potential: −1.58 V) is used as a hole moving and donating agent, and 0.02 part by weight of NK-1886 is used as a luminescent agent. The thus obtained element exhibits a green luminescence having a brightness of 300 cd/m² at 15 V and 80 mA/cm².

EXAMPLE 31

An electroluminescent element is prepared in substantially the same manner as in Example 30 except that α-(4-methoxyphenyl)-4-N,N-diphenylamino-(4'-methoxy)stilbene is used as a hole moving and donating agent. The thus obtained element exhibits a green luminescence having a brightness of 46 cd/m² at 17 V and 10 mA/cm².

EXAMPLE 32

An electroluminescent element is prepared in substantially the same manner as in Example 30 except that 9-(p-diethylaminostyryl)anthracene (first oxidation potential: +1.40 V, first reduction potential: −1.77 V) is used as a hole moving and donating agent. The thus obtained element exhibits a green luminescence having a brightness of 160 cd/m² at 18 V and 32 mA/cm².

EXAMPLE 33

An electroluminescent element is prepared in substantially the same manner as in Example 22 except that 1 part by weight of a polymer (first reduction potential: −1.93 V) represented by the formula (132):

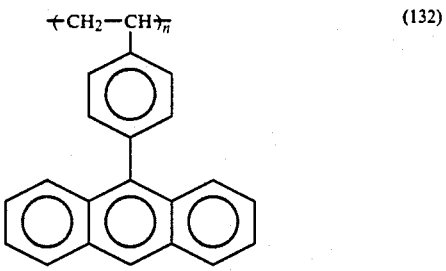

is used as an electron moving and donating agent, and Rhodamine B (first oxidation potential: +1.00 V, first reduction potential: −1.19 V) is used as a luminescent agent. The thus obtained element exhibits a yellow luminescence having a brightness of 80 cd/m² at 13 V and 10 mA/cm².

EXAMPLE 34

An electroluminescent element is prepared in substantially the same manner as in Example 22 except that 22.5 parts by weight of N,N'-diphenyl-N,N'-di(3-methylphenyl)-1,1'-biphenyl-4,4'-diamine is used as a hole moving and donating agent, 22.5 parts by weight of 2,5-bis(1-naphthyl)-1,3,4-oxadiazole is used as an electron moving and donating agent, 5 parts by weight of NK-1886 is used as a luminescent agent and 50 parts by weight of a polyester resin (Vylon-200) is used as a binder polymer. The thus obtained element exhibits a green luminescence having a brightness of 30 cd/m² at 22 V and 20 mA/cm².

EXAMPLE 35

An electroluminescent element is prepared in substantially the same manner as in Example 22 except that a coating layer having a thickness of 500 Å is formed from a toluene solution containing 35 parts by weight or N,N'-diphenyl-N,N'-di(3-methylphenyl)-1,1'-biphenyl-4,4'-diamine as a hole moving and donating agent, 35 parts by weight of 2-(1-naphthyl)-5-phenyloxazole (first oxidation potential: +1.64 V, first reduction potential: −1.85 V) as an electron moving and donating agent, 1 part by weight of Rhodamine B as a luminescent agent and 30 parts by weight of a styrenated alkyd resin (Styresole 4250 manufactured and sold by Dainippon Ink & Chemicals, Inc., Japan) as a binder polymer and that the coating layer is heated at 100° C. for 30 minutes to effect curing, thereby forming a luminescent layer. The thus obtained element exhibits a yellow luminescence having a brightness of 50 cd/m² at 16 V and 10 mA/cm².

EXAMPLE 36

An electroluminescent element is prepared in substantially the same manner as in Example 22 except that 50 parts by weight of poly(4-diphenylaminophenylmethyl methacrylate) (first oxidation potential: +0.68 V, first reduction potential: −1.89 V) is used as a hole moving and donating agent, 50 parts by weight of 1,4-bis[2-(4-methyl-5-phenyloxazolyl)]benzene (first oxidation potential: +1.21 V, first reduction potential: −1.86 V) is used as an electron moving and donating agent, and 1 part by weight of NK-1886 is used as a luminescent agent. The thus obtained element exhibits a green luminescence having a brightness of 120 cd/m² at 23 V and 10 mA/cm².

EXAMPLES 37 THROUGH 46

(Use of various luminescent agents)

An electroluminescent element is prepared in substantially the same manner as in Example 1 except that 55 parts by weight of PVK is used as a hole moving and donating agent, 45 parts by weight of 2,5-bis(1-naphthyl)-1,3,4-oxadiazole is used as an electron moving and donating agent, and 1 part by weight of each of the below-indicated compounds is individually used as a luminescent agent.

The voltage which is needed for flowing a current of 10 mA/cm² through each element, and the brightness and color of the obtained luminescence, are shown in Table 3, together with the oxidation potential and the reduction potential.

Luminescent agents employed are as follows:

Example 37: perylene

Example 38: 7-diethylamino-4-trifluoromethylcoumarin.

Example 39: 1,2,4,5,3H,6H,10H-tetrahydro-9-cyano[1-]benzopyrano[9,9a,1-gh]quinolizin-10-one.

Example 40: 1,2,4,5,3H,6H,10H-tetrahydro-8-trifluoromethyl[1]benzopyrano[9,9a,1-gh]quinolizin-10-one.

Example 41: 7-diethylamino-3-(1-methylbenzimidazolyl)coumarin.

Example 42: 2-(p-dimethylaminostyryl)naphtho[1,2-d]thiazole.

Example 43: 2-(p-dimethylaminostyryl)benzothiazole.

Example 44: Rhodamine B

Example 45: 4-dicyanomethylene-6-(p-dimethylaminostyryl)-2-methyl-4H-pyran.

Example 46: Nile Red

TABLE 3

| Ex. Nos | 1st oxidation potential (V) | 1st reduction potential (V) | Voltage (V) | Brightness (cd/m$^2$) | Color of Luminescence |
| --- | --- | --- | --- | --- | --- |
| 37 | +0.92 | −1.72 | 16 | 140 | Blue |
| 38 | +1.04 | −1.67 | 15 | 96 | Blue |
| 39 | +0.89 | −1.49 | 15 | 160 | Bluish green |
| 40 | +0.81 | −1.59 | 15 | 110 | Bluish green |
| 41 | +0.87 | −1.72 | 17 | 60 | Bluish green |
| 42 | +0.52 | −1.85 | 15 | 80 | Green |
| 43 | +0.53 | −1.82 | 15 | 52 | Green |
| 44 | +1.00 | −1.80 | 15 | 80 | Yellow |
| 45 | +0.7 | −1.28 | 15 | 84 | Orange |
| 46 | +0.76 | −1.89 | 16 | 64 | Red |

EXAMPLES 47 THROUGH 52

(Use of various amounts of hole moving and donating agent and electron moving and donating agent)

An electroluminescent element is prepared in substantially the same manner as in Example 5 except that the amounts of the hole moving and donating agent and the electron moving and donating agent are varied as indicated in Table 4 below. The amount of the luminescent agent is 1 part by weight. Voltages which that the amounts of the hole moving and donating agent and the electron moving and donating agent are varied as indicated in Table 4 below. The amount of the luminescent agent is 1 part by weight. Voltages which are needed for flowing a current of 10 mA/cm$^2$ through the individual elements and the obtained brightness values are also shown in Table 4.

TABLE 4

| Ex. Nos | Hole moving and donating agent (part by wt.) | Electron moving and donating agent (part by wt.) | Voltage (V) | Brightness (cd/m$^2$) |
| --- | --- | --- | --- | --- |
| 47 | 99 | 1 | 40 | 20 |
| 48 | 95 | 5 | 16 | 72 |
| 49 | 92.5 | 7.5 | 14 | 93 |
| 50 | 90 | 10 | 14 | 112 |
| 51 | 85 | 15 | 15 | 132 |
| 52 | 70 | 30 | 13 | 180 |
| 5 | 55 | 45 | 13 | 150 |

EXAMPLES 53 THROUGH 56

(Use of various amounts of hole moving and donating agent and electron moving and donating agent)

An electroluminescent element is prepared in substantially the same manner as in Example 22 except that the amounts of the hole moving and donating agent and the electron moving and donating agent are varied as indicated in Table 5 below. The amount of the luminescent agent is 2 parts by weight. Voltages which are needed for flowing a current of 10 mA/cm$^2$ through the individual elements and the obtained brightness values are also shown in Table 5.

TABLE 5

| Ex. Nos | Hole moving and donating agent (part by wt.) | Electron moving and donating agent (part by wt.) | Voltage (V) | Brightness (cd/m$^2$) |
| --- | --- | --- | --- | --- |
| 53 | 1 | 99 | — | — |
| 54 | 5 | 95 | 16 | 75 |
| 55 | 20 | 80 | 14 | 140 |
| 56 | 30 | 70 | 13 | 300 |
| 22 | 50 | 50 | 12 | 460 |

Note: In Example 53, a current of 10 mA/cm$^2$ cannot be flowed.

EXAMPLES 57 THROUGH 61 AND COMPARATIVE EXAMPLE 5

(Use of various amounts of luminescent agent)

An electroluminescent element is prepared in substantially the same manner as in Example 2 except that the amount of the luminescent agent is varied as indicated in Table 6 below. Voltages which are needed for flowing a current of 10 mA/cm$^2$ through the individual elements are shown in Table 6. The obtained brightness values and luminescence colors are also shown in Table 6.

TABLE 6

| Ex. Nos | Luminescent agent (part by wt.) | Voltage (V) | Brightness (cd/m$^2$) | Color of luminescence |
| --- | --- | --- | --- | --- |
| Comp. Ex. 5 | 0 | 16 | 2 | Blue |
| 57 | 0.01 | 16 | 50 | Bluish green |
| 58 | 0.1 | 17 | 90 | Green |
| 2 | 1 | 17 | 180 | Green |
| 59 | 5 | 17 | 180 | Green |
| 60 | 20 | 19 | 80 | Orangish green |
| 61 | 30 | 21 | 3 | Orange |

EXAMPLE 62

An ITO glass is washed in the same manner as in Example 1. A coating film having a thickness of 400 Å is formed on the glass by dip coating a toluene solution containing 50 parts by weight of 1,1-(4,4'-diethoxyphenyl)-N,N-(4,4'-dimethoxyphenyl)enamine and 50 parts by weight of a styrenated alkyd resin (Styresole 4250 manufactured and sold by Dainippon Ink & Chemicals Inc., Japan). Then, the film is heated at 100° C. for 30 minutes to effect curing, thereby obtaining a hole injecting and transporting layer. The same luminescent layer having a thickness of 1000 Å as formed in Example 42, is formed on the above-obtained hole injecting and transporting layer by the spin coating method, and a cathode is formed in the same manner as in Example 1. Thus, an electroluminescent element is prepared. A current of 10 mA/cm$^2$ is flowed at 12 V through this element and a green luminescence having a brightness of 85 cd/m$^2$ is exhibited. Due to the provision of the hole injecting and transporting layer, the voltage necessary for luminescence is reduced.

EXAMPLE 63

An ITO glass is washed in the same manner as in Example 1, and copper phthalocyanine (manufactured and sold by Toyo Ink Mfg. Co., Ltd., Japan) is vapor-deposited onto this glass in a thickness of 300 Å under a vacuum of $3 \times 10^{-6}$ Torrs, thereby forming a hole injecting and transporting layer. On this layer, a luminescent layer of 500 Å in thickness is formed in the same manner as in Example 62. Further, a tris(8-quinolinol) aluminum complex is vapor-deposited thereon in a thickness of 300 Å under a vacuum of $3 \times 10^{-6}$ Torrs, thereby forming a hole inhibiting layer, and then a cathode is provided in the same manner as in Example 1. Thus, an electroluminescent element is prepared. A current of 10 mA/cm$^2$ is flowed at 11 V through this element and a green luminescence having a brightness of 130 cd/m$^2$ is exhibited. Due to the provision of the hole injecting and transporting layer and the hole inhibiting layer, the luminescence efficiency is improved.

EXAMPLE 64

A luminescent layer is formed from the same compounds as in Example 5, changing the amount of the hole moving and donating agent to 40 parts by weight and the amount of the electron moving and donating agent to 60 parts by weight. Upon air drying the formed layer for 1 hour, the layer exhibits a photoelectric work function of 5.72 eV. A cathode is then immediately formed by vapor deposition, and then the obtained element is operated so as to exhibit a luminescence. The element exhibits a uniform luminescence without non-luminescent portions.

Separately, the luminescent layer is allowed to stand for 1 day after the formation thereof. As a result, the layer exhibits a photoelectric work function of 5.46 eV. A cathode is then formed by vapor deposition and the element is operated so as to exhibit a luminescence. The element exhibits non-uniformity in the luminescence intensity and has 5 non-luminescent portions each having a diameter of about 0.1 mm.

EXAMPLE 65

A sine wave voltage having an effective voltage of 20 V and a frequency of 50 Hz is applied to the electroluminescent element obtained in Example 5. As a result, the element exhibits a green luminescence having a brightness of 300 cd/m$^2$. After the element is continuously operated for 200 hours, the brightness is 276 cd/m$^2$. On the other hand, when a direct current voltage of 13 V is applied to the element of Example 5, the brightness after a continuous operation for 200 hours is 23 cd/m$^2$.

EXAMPLE 66

ITO glass (manufactured and sold by Hoya Corp., Japan), which is a glass substrate prepared by forming an ITO film having a thickness of 1000 Å on a glass plate of $100 \times 100 \times 1.1$ mm in size, is washed in the same manner as in Example 1. This glass substrate is used as an anode.

13.6 g of PVK as a hole moving and donating agent, 1.51 g of perylene as an electron moving and donating agent and 0.21 g of coumarin 6 as a luminescent agent are dissolved in 1000 g of 1,2-dichloroethane, thereby obtaining a coating solution for forming a luminescent layer. The thus obtained coating solution is placed in dipping bath 6 of FIG. 1. Further, 50 cc of 1,2-dichloroethane is placed in solvent vessel 3.

The glass substrate having been washed is held by catching device 5 fixed at the end of vertical mover 4, and the vertical mover 4 is lowered so that the glass substrate is dipped into the coating solution to a position 10 mm below the upper edge of the substrate. Then, the glass substrate is raised at a rate of 150 mm/minute, and when the lower edge of the substrate comes out of the solution, the raising is stopped and the substrate is kept at that position, to thereby effect leveling in the solvent vapor. Then, the substrate is raised at a rate of 150 mm/minute so as to take the substrate out of dipping bath 6, and is immediately subjected to drying at 50° C. in a drying apparatus. Thus, a luminescent layer is formed on the substrate.

Figure 2:
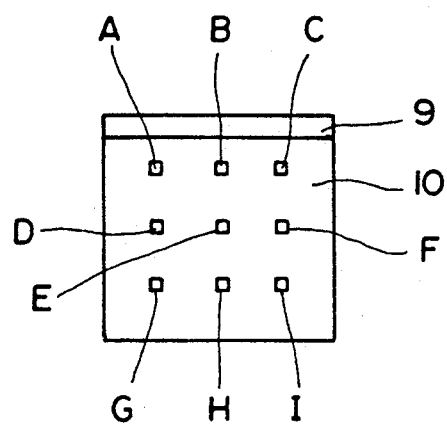
FIG. 2 is a diagrammatic plan view showing the arangement of nine cathodes for preparing an electroluminescent element assembly containing nine electroluminescent elements as prepared in Example 66 described later.

9 Cathodes (A to I shown in FIG. 2) each having a $1 \times 1$ mm size are formed on the luminescent layer by a vapor deposition of metallic magnesium through a shadow mask. Thus, the size of each of the obtained elements is $1 \times 1$ mm. As shown in FIG. 2, cathodes A, B and C are formed in alignment at intervals of 25 mm at a distance of 25 mm from the upper edge of the substrate. Cathodes D, E and F are formed in alignment at intervals of 25 mm at a distance of 50 mm from the upper edge of the substrate. Cathodes G, H and I are formed in alignment at intervals of 25 mm at a distance of 75 mm from the upper edge of the substrate.

Then, a gold wire as a lead is connected to each electrode (cathode) by means of a silver paste. Thus, an electroluminescent element assembly containing 9 elements (designated as A-1 to I-1, respectively) is prepared. When a direct current voltage of 17 V is applied to each element using ITO portion 9 as an anode, a current of about 0.1 mA is flowed though each element and each element exhibits a green luminescence.

An attachment lens (AL-7, attached to the below-mentioned meter BM-7) is attached to a color/luminance meter BM-7 (manufactured and sold by TOPCON CO., LTD., Japan) and the lens is focused on the luminescent surface of the element at a measurement angle of 0.1° and at a distance of 52 mm between the lens and the luminescent surface (In this instance, the measuring area is 0.1 mm$\phi$).

With respect to the sites for measuring brightness for the element of 1 mm $\times$ 1 mm size, measurement is conducted at 9 points consisting of 3 points present at a distance of 0.25 mm from one side of the element and at intervals of 0.25 mm, 3 points present at a distance of 0.5 mm from the side and at intervals of 0.25 mm and 3 points present at a distance of 0.75 mm from the side and at intervals of 0.25 mm. The results of the measurement are shown in Table 7.

An electroluminescent element assembly containing nine elements (A-2 to I-2) is prepared, and the brightnesses of the elements are measured in substantially the same manner as described above, except that no solvent is placed in solvent vessel 3, that after the glass substrate is dipped in the coating solution to a position 10 mm below the upper edge of the substrate, the substrate is raised at a rate of 150 mm/minute until it is completely taken out of dipping bath 6, and the substrate is kept in the atmosphere for 1 minute, immediately followed by drying at 50° C. in a drying apparatus. The results are shown in Table 7.

As apparent from Tables 7 and 8, when the coating for forming a luminescent layer is subjected to leveling, a uniform luminescence is obtained with a small brightness dispersion relative to the average brightness within a single element, whereas when the leveling is not conducted, the brightness dispersion within a single element is large and it is possible that the obtained element cannot exhibit luminescence due to an electric leak.

EXAMPLE 67

The electroluminescent elements A-1 through I-1 and A-2, D-2, E-2, F-2, H-2 and I-2 obtained in Example 66 are individually subjected to continuous operation by applying a direct current of 0.1 mA using a constant current power source. After the operation is conducted for 100 hours, the brightness is measured at the same measuring sites as those employed in Example 66 for measuring the initial brightness. The results are shown in Table 9. As apparent from Table 9, elements A-1 through I-1 which are small in brightness dispersion within a single element are capable of exhibiting a luminescence of high brightness for a long period of time as compared to elements A-2, D-2, E-2, F-2, H-2 and I-2 which are large in brightness dispersion within a single element.

TABLE 7

| Element | Brightness (cd/m$^2$) | Average brightness | Brightness dispersion (%) |
|---|---|---|---|
| A-1 | 180, 185, 179, 180, 176, 183, 182, 176, 185 | 180.6 | 2.4 |
| B-1 | 185, 182, 187, 180, 185, 178, 187, 180, 179 | 182.3 | 2.6 |
| C-1 | 180, 185, 185, 183, 182, 182, 183, 183, 184 | 182.9 | 1.1 |
| D-1 | 172, 179, 176, 171, 176, 176, 175, 179, 177 | 175.8 | 2.7 |
| E-1 | 172, 175, 176, 179, 176, 171, 174, 176, 176 | 175.0 | 2.3 |
| F-1 | 172, 176, 175, 175, 174, 173, 171, 172, 176 | 173.9 | 1.7 |
| G-1 | 172, 171, 172, 171, 173, 176, 170, 171, 172 | 172.1 | 2.3 |
| H-1 | 172, 171, 172, 174, 175, 177, 179, 171, 172 | 172.9 | 3.5 |
| I-1 | 172, 174, 175, 171, 171, 170, 170, 171, 172 | 171.7 | 1.9 |

TABLE 8

| Element | Brightness (cd/m$^2$) | Average brightness | Brightness dispersion (%) |
|---|---|---|---|
| A-2 | 164, 189, 179, 152, 181, 182, 178, 191, 168 | 176.0 | 13.6 |
| B-2 | No luminescence attained | — | — |
| C-2 | No luminescence attained | — | — |
| D-2 | 140, 141, 172, 138, 135, 143, 141, 138, 130 | 141.9 | 21.2 |
| E-2 | 123, 127, 125, 119, 141, 148, 116, 131, 125 | 128.4 | 15.3 |
| F-2 | 131, 133, 130, 121, 138, 140, 130, 135, 141 | 133.1 | 9.1 |
| G-2 | No luminescence attained | — | — |
| H-2 | 98, 116, 109, 94, 103, 112, 103, 107, 111 | 105.9 | 11.2 |
| I-2 | 115, 103, 116, 113, 116, 119, 116, 104, 113 | 112.8 | 8.7 |

TABLE 9

| Element | Brightness (cd/m$^2$) | Average brightness |
|---|---|---|
| A-1 | 126, 130, 125, 126, 123, 128, 127, 124, 129 | 126.4 |
| B-1 | 130, 127, 130, 126, 129, 125, 129, 127, 125 | 127.3 |
| C-1 | 126, 129, 129, 127, 127, 127, 127, 127, 127 | 127.3 |
| D-1 | 121, 125, 125, 121, 125, 125, 125, 125, 125 | 123.9 |
| E-1 | 121, 125, 125, 125, 125, 123, 125, 125, 125 | 124.1 |
| F-1 | 122, 123, 123, 126, 123, 122, 123, 123, 125 | 123.3 |
| G-1 | 122, 121, 124, 123, 125, 126, 125, 125, 123 | 123.7 |
| H-1 | 121, 122, 125, 124, 124, 125, 125, 122, 123 | 123.3 |
| I-1 | 123, 123, 124, 123, 123, 122, 121, 123, 123 | 122.8 |
| A-2 | See Note | — |
| D-2 | 28, 25, 0, 27, 23, 15, 13, 18, 29 | 19.7 |
| E-2 | 15, 17, 16, 12, 11, 15, 12, 15, 16 | 14.4 |
| F-2 | 16, 16, 17, 21, 15, 14, 15, 15, 13 | 15.7 |
| H-2 | 18, 16, 16, 20, 19, 12, 15, 15, 15 | 16.2 |
| I-2 | 15, 20, 16, 18, 16, 16, 12, 18, 15 | 16.3 |

Note:
No luminescence is attained after 85 hours of operation.

What is claimed is:

1. An electroluminescent element comprising:
   an anode for injecting holes, a cathode for injecting electrons and, disposed therebetween, an organic luminescent layer, at least one of said anode and cathode being transparent,
   said organic luminescent layer comprising a three component mixture of at least one fluorescent luminescent agent, at least one hole moving and donating agent capable of moving the holes injected from said anode and donating the holes to said luminescent agent, and at least one electron moving and donating agent capable of moving the electrons injected from said cathode and donating the electrons to said luminescent agent,
   said luminescent agent having a first oxidation potential which is equal to or less noble relative to that exhibited by said hole moving and donating agent,
   said luminescent agent having a first reduction potential which is equal to or noble relative to that exhibited by said electron moving and donating agent,
   said first oxidation potential of each of said three component agents and said first reduction potential of each of said three component agents being measured by cyclic voltammetry with respect to a solution of said agent in a solvent for said agent.

2. The electroluminescent element according to claim 1, wherein said hole moving and donating agent has a first reduction potential less noble relative to that exhibited by said electron moving and donating agent, and said electron moving and donating agent has a first oxidation potential noble relative to that exhibited by said hole moving and donating agent.

3. The electroluminescent element according to claim 1, wherein said hole moving and donating agent is comprised of at least one compound having at least two benzene nuclei and at least one nitrogen atom.

4. The electroluminescent element according to claim 3, wherein said compound is selected from the group consisting of a tertiary amine compound, a hydrazone compound, a pyrazoline compound, an enamine compound, a styryl compound, a stilbene compound, a triphenylmethane compound having an amino substituent and an oxadiazole compound having an amino substituent.

5. The electroluminescent element according to claim 3, wherein said compound is a carbazole compound.

6. The electroluminescent element according to claim 5, wherein said carbazole compound is selected from the group consisting of N-isopropylcarbazole, N-phenylcarbazole and N-ethylcarbazole.

7. The electroluminescent element according to claim 1, wherein said hole moving and donating agent is comprised of at least one polymer having a hole mobility of at least $1 \times 10^{-10}$ cm$^2$/V·sec at a field strength of $1 \times 10^5$ V/cm.

8. The electroluminescent element according to claim 7, wherein said polymer is a homopolymer or a copolymer of an ethylenically unsaturated monomer.

9. The electroluminescent element according to claim 8, wherein said polymer is a poly(N-vinylcarbazole) homopolymer.

10. The electroluminescent element according to claim 1, wherein said electron moving and donating agent is comprised of at least one polynuclear compound having at least 3 condensed rings.

11. The electroluminescent element according to claim 10, wherein said polynuclear compound is selected from the group consisting of an anthracene compound, a phenanthrene compound, a pyrene compound, a perylene compound, a chrysene compound, a triphenylene compound, a fluoranthene compound and a periflanthene compound.

12. The electroluminescent element according to claim 1, wherein said electron moving and donating agent is comprised of at least one heterocyclic compound.

13. The electroluminescent element according to claim 12, wherein said heterocyclic compound is an azole compound or a diazole compound.

14. The electroluminescent element according to claim 13, wherein said azole compound and diazole compound are an oxazole compound and an oxadiazole compound, respectively.

15. The electroluminescent element according to claim 1, wherein said electron moving and donating agent is comprised of at least one vinylene compound.

16. The electroluminescent element according to claim 1, wherein said electron moving and donating agent is comprised of at least one polymer.

17. The electroluminescent element according to claim 16, wherein said polymer is a homopolymer or a copolymer of an ethylenically unsaturated polynuclear compound monomer having at least 3 condensed rings.

18. The electroluminescent element according to claim 16, wherein said polymer has a main chain or a side chain having a heterocyclic compound group.

19. The electroluminescent element according to claim 18, wherein said polymer has a main chain or a side chain having an oxadiazole unit.

20. The electroluminescent element according to claim 1, wherein said luminescent agent is comprised of at least one condensed polynuclear aromatic compound having at least 3 condensed rings.

21. The electroluminescent element according to claim 1, wherein said luminescent agent is comprised of at least one aromatic compound having at least 3 benzene nuclei.

22. The electroluminescent element according to claim 1, wherein said luminescent agent is comprised of at least one dye.

23. The electroluminescent element according to claim 22, wherein said dye is selected from the group consisting of a coumarin fluorescent dye, a dicyanopyran fluorescent dye, a thiopyran fluorescent dye, a polymethine fluorescent dye, a cyanine fluorescent dye, an oxabenzanthracene fluorescent dye, a xanthene fluorescent dye, a Rhodamine fluorescent dye, a fluorescein fluorescent dye, an acridine fluorescent dye, a bis(styryl)benzene fluorescent dye, a pyrene fluorescent dye, an oxazine fluorescent dye, a phenylene oxide fluorescent dye, a pyrylium fluorescent dye, a thiapyrylium fluorescent dye, a carbostyryl fluorescent dye and a perylene fluorescent dye.

24. The electroluminescent element according to claim 1, wherein said organic luminescent layer is a layer prepared by dissolving or dispersing said luminescent agent, said hole moving and donating agent and said electron moving and donating agent in a solvent to obtain a solution or a dispersion, and applying the solution or the dispersion to said anode or said cathode to form a coating thereon, and drying the coating to form the organic luminescent layer.

25. The electroluminescent element according to claim 24, wherein said coating is subjected to leveling under a solvent vapor during the drying.

26. The luminescent element according to claim 24, wherein said organic luminescent layer contains at least one binder polymer.

27. The luminescent element according to claim 26, wherein said binder polymer is a curable resin.

28. The luminescent element according to claim 1 or 24, wherein the weight ratio of said hole moving and donating agent to said electron moving and donating agent is in the range of from 5:95 to 95:5.

29. The luminescent element according to claim 1 or 24, wherein said luminescent agent is comprised in said organic luminescent layer in an amount of from 0.01 to 20 parts by weight, relative to 100 parts by weight of the total of the hole moving and donating agent and the electron moving and donating agent.

30. The luminescent element according to claim 1 or 24, wherein said organic luminescent layer has a thickness of 1 μm or less.

31. The luminescent element according to claim 1 or 24, which further comprises at least one member selected from the group consisting of a hole injecting and transporting layer disposed between said anode and said organic luminescent layer and a hole inhibiting layer disposed between said organic luminescent layer and said cathode, said hole injecting and transporting layer facilitating the injection of holes from said anode and transporting the injected holes to said organic luminescent layer, said hole inhibiting layer inhibiting passage of the holes into said cathode to hold the holes within said organic luminescent layer, thereby allowing the holes to effectively contribute to luminescence.

32. The electroluminescent element according to claim 1 or 24, wherein said element is driven by alternate current.

33. The electroluminescent element according to claim 1 or 24, wherein said element exhibits a statistical brightness dispersion of not greater than 5% relative to an average brightness of from 122.8 to 182.9 cd/m².

34. The electroluminescent element according to claim 1 or 24, wherein said hole moving and donating agent has a first oxidation potential which is less noble as compared to +2.0 V.

35. The electroluminescent element according to claim 1 or 24, wherein said electron moving and donating agent has a first reduction potential which is noble as compared to −2.50 V.

* * * * *